US011081588B2

(12) United States Patent
Sugimoto

(10) Patent No.: US 11,081,588 B2
(45) Date of Patent: Aug. 3, 2021

(54) ELECTRO-OPTICAL DEVICE AND ELECTRONIC APPARATUS

(71) Applicant: SEIKO EPSON CORPORATION, Tokyo (JP)

(72) Inventor: Yohei Sugimoto, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 200 days.

(21) Appl. No.: 16/556,478

(22) Filed: Aug. 30, 2019

(65) Prior Publication Data
US 2020/0075774 A1 Mar. 5, 2020

(30) Foreign Application Priority Data
Sep. 3, 2018 (JP) .............................. JP2018-164243

(51) Int. Cl.
H01L 27/12 (2006.01)
G02F 1/1343 (2006.01)
G02F 1/136 (2006.01)
H01L 29/786 (2006.01)
G02F 1/1362 (2006.01)
G02F 1/1368 (2006.01)
G03B 33/12 (2006.01)
G03B 21/00 (2006.01)

(52) U.S. Cl.
CPC ...... H01L 29/78633 (2013.01); G02F 1/1368 (2013.01); G02F 1/136209 (2013.01); G02F 1/136213 (2013.01); G02F 1/136286 (2013.01); H01L 27/1222 (2013.01); H01L 27/1244 (2013.01); H01L 27/1255 (2013.01); H01L 29/78621 (2013.01); H01L 29/78675 (2013.01); G03B 21/006 (2013.01); G03B 33/12 (2013.01)

(58) Field of Classification Search
None
See application file for complete search history.

(56) References Cited

U.S. PATENT DOCUMENTS

2001/0005019 A1* 6/2001 Ishikawa ........... H01L 29/78645
257/59
2004/0008295 A1 1/2004 Ueda et al.
2004/0257489 A1* 12/2004 Gotoh ............... H01L 29/78633
349/44

(Continued)

FOREIGN PATENT DOCUMENTS

JP 2004-045576 A 2/2004
JP 2004-151546 A 5/2004

(Continued)

Primary Examiner — Daniel Whalen
(74) Attorney, Agent, or Firm — Oliff PLC

(57) ABSTRACT

An electro-optical device includes a base material as a substrate, a TFT as a transistor, a scanning line as a light shielding layer between the base material and the TFT, and a holding capacitor between the base material and the scanning line. The holding capacitor includes a first conductive layer, a second conductive layer provided on the first conductive layer via a first capacitor insulating layer, a third conductive layer electrically connected to the second conductive layer via a first contact hole provided in an insulating layer covering the second conductive layer, and a fourth conductive layer provided on the third conductive layer via a second capacitor insulating layer.

10 Claims, 17 Drawing Sheets

(56) References Cited

U.S. PATENT DOCUMENTS

2006/0132667 A1   6/2006   Matsuzaki et al.
2007/0165148 A1   7/2007   Koyama

FOREIGN PATENT DOCUMENTS

| JP | 2004-271903 A | 9/2004 |
| JP | 2006-178235 A | 7/2006 |
| JP | 2007-187921 A | 7/2007 |
| JP | 2009-069727 A | 4/2009 |
| JP | 2012-078624 A | 4/2012 |
| JP | 2014-056212 A | 3/2014 |
| JP | 2015-094880 A | 5/2015 |

* cited by examiner

ELECTRO-OPTICAL DEVICE AND ELECTRONIC APPARATUS

The present application is based on, and claims priority from JP Application Serial Number 2018-164243, filed Sep. 3, 2018, the present disclosure of which is hereby incorporated by reference herein in its entirety.

BACKGROUND

1. Technical Field

The present disclosure relates to an electro-optical device and an electronic apparatus including the electro-optical device.

2. Related Art

Examples of an electro-optical device include an active drive type liquid crystal device including a thin film transistor as a switching element for each pixel. When such a liquid crystal device is used as, for example, a light modulating means of a projection-type display device (projector), intense light from a light source is incident on pixels as compared to when the liquid crystal device is used as a general display device. When a portion of the light incident on the pixels is incident on a semiconductor layer of the thin film transistor, an optical leakage current is generated, and thus, an operation in the thin film transistor becomes unstable, and a desired display state cannot be obtained. Therefore, a light shielding structure configured to block light incident on the semiconductor layer of the thin film transistor has been introduced into the active drive type liquid crystal device.

For example, in JP-A-2015-94880 there is disclosed an electro-optical device including an electro-optical material layer disposed between a first substrate and a second substrate, a convex portion disposed at the electro-optical material layer side of the first substrate, a capacitance element disposed to cover an upper surface and a side surface of the convex portion, a first insulating layer disposed to cover the capacitance element, and a switching element disposed on the first insulating layer and including a semiconductor layer, a gate electrode, and a drain electrode. In addition, in JP-A-2015-94880 there are described the convex portion disposed to overlap the drain electrode in plan view, a light shielding layer having conductivity and disposed to extend along a first direction between the first insulating layer and the semiconductor layer, and the convex portion disposed to extend in the first direction to overlap the light shielding layer in plan view. According to the electro-optical device of JP-A-2015-94880, the capacitance element and the light shielding layer are disposed in a light shielding region surrounding an opening area of a pixel, and it is possible to achieve a high opening ratio and also ensure electrical capacitance in the capacitance element.

In the electro-optical device of JP-A-2015-94880 described above, disposing the capacitance element to cover the convex portion provided in the first substrate complicates a wiring structure in a lower layer of the semiconductor layer. Specifically, the capacitance element is electrically coupled to the drain electrode and capacitance wiring of the thin film transistor being as a switching element. In addition, the capacitance element includes a first capacitance electrode and a second capacitance electrode disposed to sandwich a dielectric layer and face each other. The first capacitance electrode disposed in a lower layer of the second capacitance electrode is provided to extend in the first direction and a second direction in the light shielding region, and thus the first capacitance electrode functions as capacitance wiring. As a result, disposing the capacitance element in the convex portion increases a depth on the first substrate of the contact hole associated with the coupling to the wiring for imparting a predetermined potential to the first capacitance electrode functioning as the capacitance wiring, and increases complexity of an electrical wiring structure associated with the capacitance element. At the same time, there has been a problem in that increasing complexity of the wiring structure increases complexity of the light shielding structure for blocking light incident on the semiconductor layer.

SUMMARY

An electro-optical device according to the present application includes a substrate, a transistor, a light shielding layer between the substrate and the transistor, and a holding capacitor between the substrate and the light shielding layer. The holding capacitor includes a first conductive layer, a second conductive layer provided on the first conductive layer via a first capacitor insulating layer, a third conductive layer electrically coupled to the second conductive layer via a first contact hole provided in an insulating layer covering the second conductive layer, and a fourth conductive layer provided on the third conductive layer via a second capacitor insulating layer.

In the electro-optical device described above, preferably the first conductive layer includes a first body portion, a first portion extending from the first body portion in a first direction, and a second portion extending from the first body portion in a second direction intersecting the first direction, the second conductive layer includes a second body portion, a first protruding portion protruding from the second body portion in the first direction, and a second protruding portion protruding from the second body portion in the second direction, the third conductive layer includes a third body portion, a third protruding portion protruding from the third body portion in the first direction, and a fourth protruding portion protruding from the third body portion in the second direction, the fourth conductive layer includes a fourth body portion, a third portion extending from the fourth body portion in the first direction, and a fifth protruding portion protruding from the fourth body portion in the second direction, the light shielding layer includes a fifth body portion, a fourth portion extending from the fifth body portion in the first direction, and a sixth protruding portion protruding from the fifth body portion in the second direction, and the first body portion, the second body portion, the third body portion, the fourth body portion, and the fifth body portion are disposed to overlap one another in plan view.

In the electro-optical device described above, a semiconductor layer of the transistor may be disposed, in the second direction, to overlap the first body portion and the second portion of the first conductive layer, the second body portion and the second protruding portion of the second conductive layer, the third body portion and the fourth protruding portion of the third conductive layer, the fourth body portion and the fifth protruding portion of the fourth conductive layer, and the fifth body portion and the sixth protruding portion of the light shielding layer, in plan view.

In the electro-optical device described above, the first contact hole may be disposed to overlap the second body portion of the second conductive layer in plan view.

In the electro-optical device described above, an end portion of the second protruding portion of the second conductive layer may be disposed to protrude from an end portion of the fourth protruding portion of the third conductive layer in the second direction, and a second contact hole configured to electrically couple the second conductive layer and the semiconductor layer of the transistor may be disposed in the end portion of the second protruding portion.

In the electro-optical device described above, preferably the second contact hole is provided with a first relay layer provided in the same layer as the light shielding layer, and a second relay layer provided in the same layer as a gate electrode of the transistor.

In the electro-optical device described above, the second conductive layer and a portion of the first relay layer in contact with the second conductive layer may include a same conductive material.

In the electro-optical device described above, preferably the same conductive material is a polysilicon imparted with conductivity.

The electro-optical device described above may include an electrode in contact with the second relay layer and in contact with the semiconductor layer of the transistor.

An electronic apparatus according to the present disclosure includes the electro-optical device described above.

DESCRIPTION OF EXEMPLARY EMBODIMENTS

Exemplary embodiments of the present disclosure will be described below with reference to the accompanying drawings. Note that, in the following figures, parts described are illustrated in an enlarged or reduced state as appropriate to the extent that the parts can be recognized.

In this exemplary embodiment, an active drive type liquid crystal device including a Thin Film Transistor (hereinafter referred to as a TFT) for each pixel will be described as an example of an electro-optical device. This liquid crystal device can be used suitably as, for example, a light modulation element (liquid crystal light valve) of a projection-type display device (liquid crystal projector) described below.

Electro-Optical Device

Figure 1:
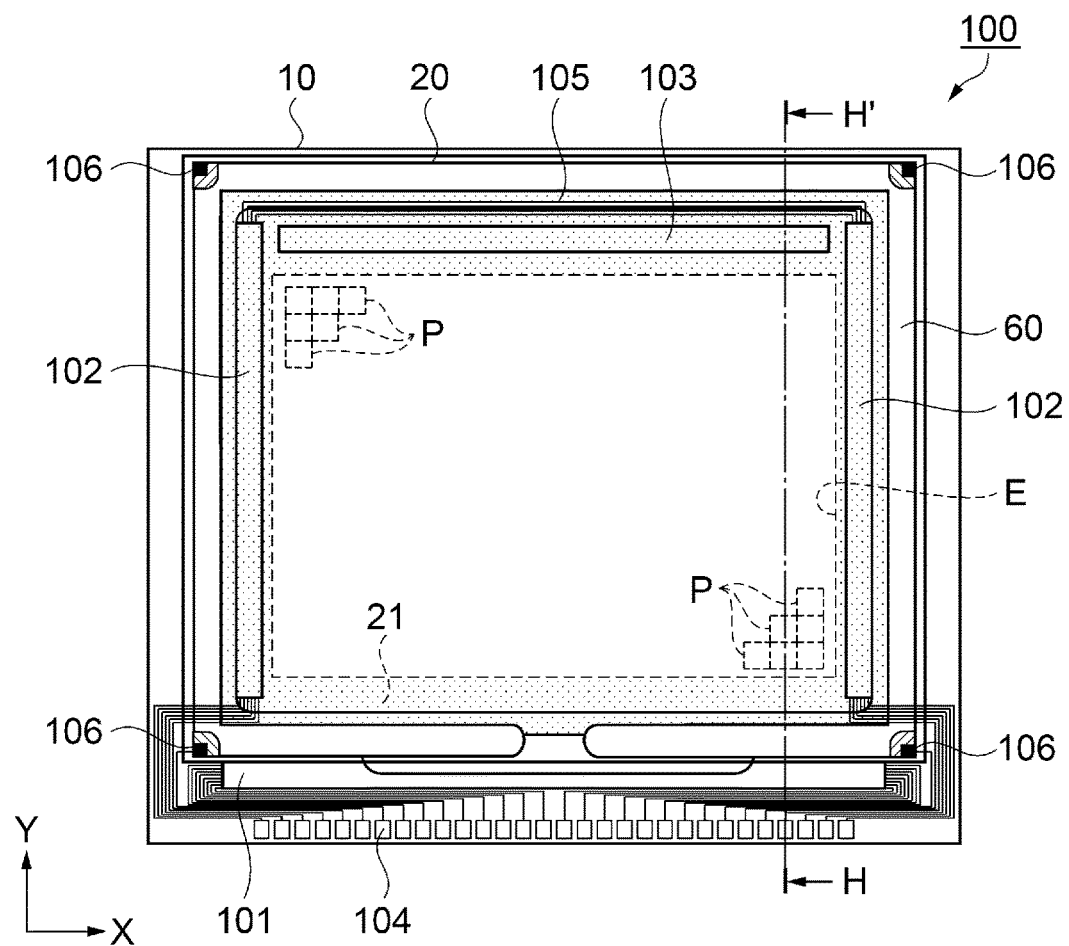
FIG. 1 is a schematic plan view illustrating a configuration of a liquid crystal device as an electro-optical device.

First, a main configuration of a liquid crystal device being an electro-optical device according to this exemplary embodiment will be described with reference to FIG. 1 to FIG. 3. FIG. 1 is a schematic plan view illustrating a configuration of a liquid crystal device as an electro-optical device, FIG. 2 is a schematic cross-sectional view of a structure of the liquid crystal device taken along line H-H' of FIG. 1, and FIG. 3 is an equivalent circuit diagram illustrating an electrical configuration of the liquid crystal device.

Figure 2:
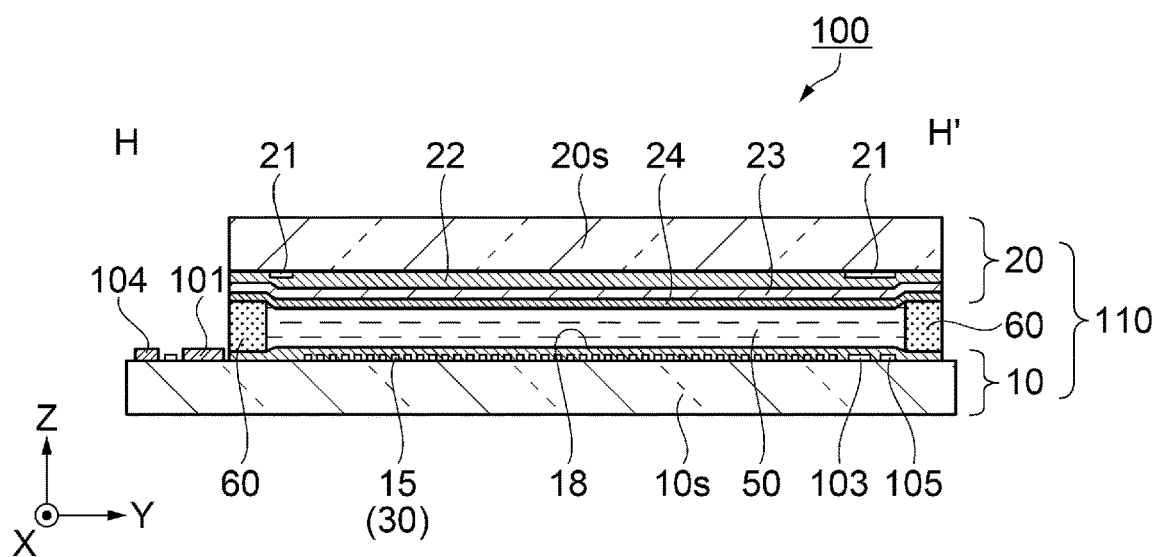
FIG. 2 is a schematic cross-sectional view illustrating a structure of the liquid crystal device taken along line H-H' in FIG. 1.
Figure 3:
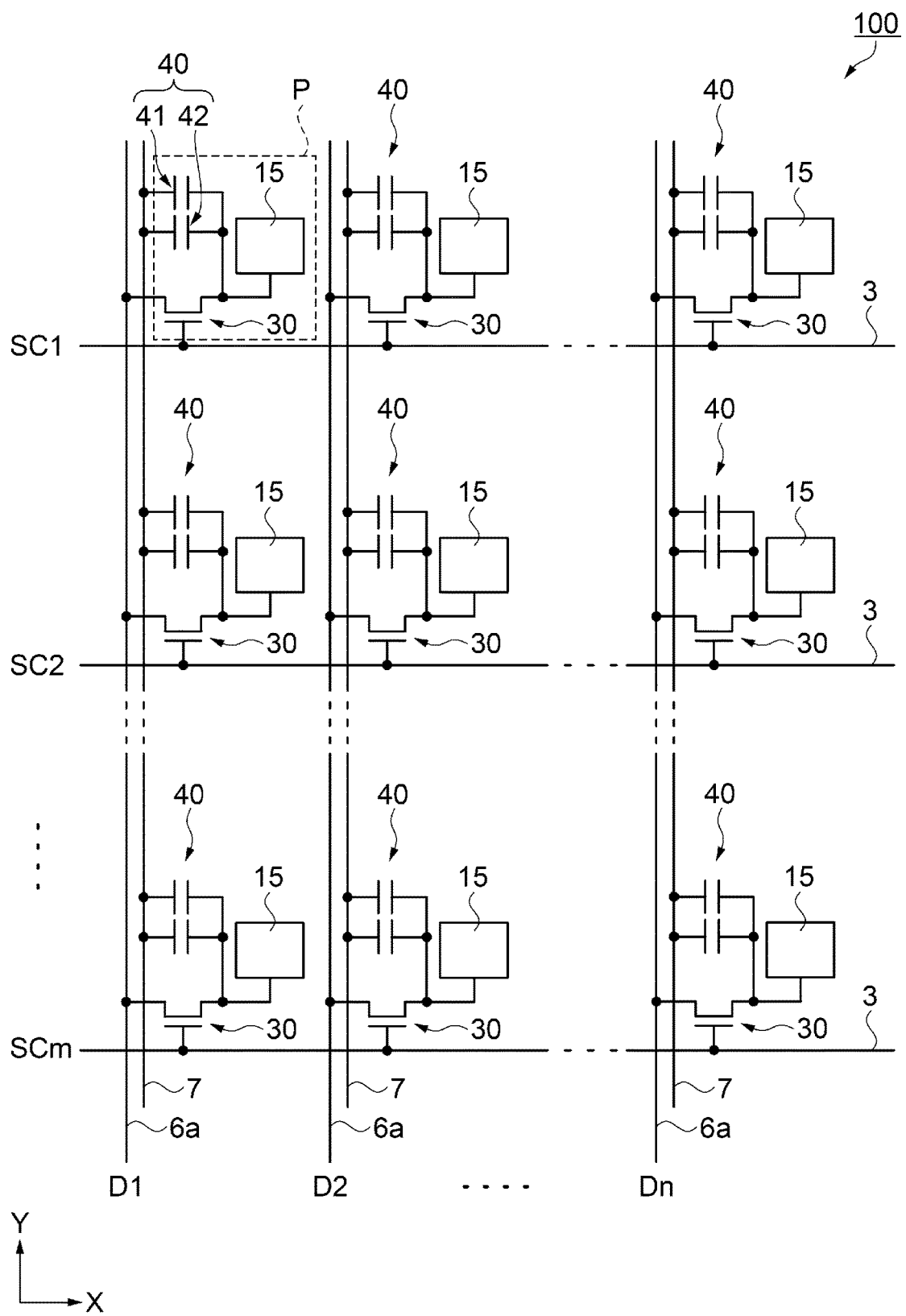
FIG. 3 is an equivalent circuit diagram illustrating an electrical configuration of the liquid crystal device.

As illustrated in FIG. 1 and FIG. 2, a liquid crystal device 100 being an electro-optical device of the exemplary embodiment includes a liquid crystal panel 110 including an element substrate 10 and a counter substrate 20 disposed to face each other, and a liquid crystal layer 50 sandwiched between a pair of these substrates. For example, a quartz substrate or a glass substrate having a translucent property is used for each of a base material 10s of the element substrate 10 and a base material 20s of the counter substrate 20. Note that the base material 10s corresponds to the substrate according to the present disclosure.

The element substrate 10 is slightly larger in size than the counter substrate 20. The element substrate 10 and the counter substrate 20 are bonded to each other via a seal portion 60 disposed in a frame-like shape along an outer edge portion of the counter substrate 20, and liquid crystal having positive or negative dielectric anisotropy is encapsulated in a gap between the element substrate 10 and the counter substrate 20 to constitute the liquid crystal layer 50. As the seal portion 60, for example, an adhesive such as a thermosetting or ultraviolet curable epoxy resin is employed. The seal portion 60 includes a spacer (not illustrated) configured to keep an interval between the pair of substrates constant.

A display region E in which a plurality of pixels P are arrayed in a matrix shape is provided at an inner side of the seal portion 60. In addition, on the counter substrate 20, a partition portion 21 surrounding the display region E is provided between the seal portion 60 and the display region E. The partition portion 21 includes, for example, a metal having a light shielding property or an alloy or an oxide of the metal. Note that the display region E may include dummy pixels disposed to surround the plurality of pixels P in addition to the plurality of pixels P contributing to a display.

The element substrate 10 is provided with a terminal portion in which a plurality of external connection terminals 104 are arrayed. A data line drive circuit 101 is provided between a first side portion along the terminal portion of the element substrate 10 and the seal portion 60. In addition, an inspection circuit 103 is provided between the seal portion 60 along a second side portion facing the first side portion and the display region E. Further, scanning line drive circuits 102 are provided between the seal portion 60 along a third side portion and a fourth side portion orthogonal to the first side portion and facing each other and the display region E, respectively. Between the seal portion 60 along the second side portion and the inspection circuit 103, a plurality of lines of wiring 105 configured to connect the two scanning line drive circuits 102 are provided.

The wiring connected to the data line drive circuit 101 and the scanning line drive circuits 102 are coupled to the plurality of external connection terminals 104 disposed along the first side portion. Hereinafter, a description will be made assuming that a direction along the first side portion is an X direction, and a direction along the third side portion and the fourth side portion is a Y direction. In addition, herein, a direction orthogonal to the X direction and the Y direction and oriented from the element substrate 10 toward the counter substrate 20 is assumed to be a Z direction. Then, a view taken along the Z direction from the counter substrate 20 side will be referred to as a "plan view" or described as "planarly".

As illustrated in FIG. 2, the element substrate 10 includes the base material 10s, a TFT 30 and a pixel electrode 15 formed on a surface at the liquid crystal layer 50 side of the base material 10s, an alignment film 18 covering the pixel electrode 15, and the like. The TFT 30 and the pixel electrode 15 are constituent elements of each pixel P.

The counter substrate 20 includes the base material 20s, and includes the partition portion 21, a planarization layer 22, a counter electrode 23, an alignment film 24 covering the counter electrode 23, and the like sequentially stacked on a surface at the liquid crystal layer 50 side of the base material 20s.

As illustrated in FIG. 1, the partition portion 21 surrounds the display region E and is provided at a position where the partition portion 21 planarly overlaps the scanning line drive circuit 102 and the inspection circuit 103. Thus, the partition portion 21 blocks light incident from the counter substrate 20 side on peripheral circuits including these drive circuits, and has a role of preventing a malfunction of the peripheral circuits due to the light. In addition, the partition portion 21 blocks light to prevent unnecessary stray light from being incident on the display region E, and ensures high contrast in a display of the display region E.

The planarization layer 22 includes, for example, an inorganic material such as a silicon oxide, and the planarization layer 22 has a translucent property and is provided to cover the partition portion 21. Such a planarization layer 22 includes a silicon oxide film formed by using, for example, a plasma Chemical Vapor Deposition (CVD) method, and has a film thickness to the extent that surface irregularities in the counter electrode 23 to be formed on the planarization layer 22 can be mitigated.

The counter electrode 23 includes a transparent conductive layer such as an Indium Tin Oxide (ITO) film and an Indium Zinc Oxide (IZO) film, and the counter electrode 23 covers the planarization layer 22 and is also electrically coupled to wiring on the element substrate 10 side by vertical conducting portions 106 provided at four corners of the counter substrate 20 as illustrated in FIG. 1.

The alignment film 18 covering the pixel electrode 15 and the alignment film 24 covering the counter electrode 23 are set on the basis of an optical design of the liquid crystal device 100, and as the alignment films 18 and 24, an oblique vapor deposition film (inorganic alignment film) of an inorganic material such as a silicon oxide is employed. As the alignment films 18, 24, an organic alignment film of polyimide or the like may be employed in addition to the inorganic alignment film.

Such a liquid crystal device 100 is of a transmissive type, and in the liquid crystal device 100, an optical design of a normally white mode in which display is bright when the pixels P are not driven or a normally black mode in which display is dark when the pixels P are not driven is employed. In the liquid crystal device 100, a polarizing element is disposed on both the light incidence side and the light exit side of the liquid crystal panel 110 in accordance with the optical design. In the exemplary embodiment, it is assumed that light is incident on the liquid crystal panel 110 from the element substrate 10 side, but light may be incident from the counter substrate 20 side.

Next, an electrical configuration of the liquid crystal device 100 will be described with reference to FIG. 3. The liquid crystal device 100 includes a plurality of scanning lines 3 and a plurality of data lines 6a as signal lines insulated from one another and orthogonal to one another at least in the display region E, and common potential lines 7 to which a common potential is applied. Note that, in FIG. 3, the common potential lines 7 are illustrated as parallel along the data lines 6a extending in the Y direction, but the common potential lines 7 are not necessarily limited to this.

In each region partitioned by the scanning lines 3 extending in the X direction and the data lines 6a extending in the Y direction, the pixel electrode 15, the TFT 30, and a holding capacitor 40 are provided, and constitute a pixel circuit of the pixel P. The holding capacitor 40 includes two capacitance elements 41, 42 electrically coupled in parallel between the TFT 30 and the pixel electrode 15, and the common potential line 7.

Each scanning line 3 is electrically coupled to a gate of the TFT 30, each data line 6a is electrically coupled to a source of the TFT 30, and the pixel electrode 15 is electrically coupled to a drain of the TFT 30.

The data lines 6a are coupled to the data line drive circuit 101 (refer to FIG. 1). Image signals D1, D2, . . . , Dn are supplied from the data line drive circuit 101 to each pixel P via the data lines 6a. The scanning lines 3 are coupled to the scanning line drive circuit 102 (refer to FIG. 1). Scan signals SC1, SC2, . . . , SCm are supplied from the scanning line drive circuit 102 to each pixel P via the scanning lines 3.

The image signals D1 to Dn supplied from the data line drive circuit 101 may be line-sequentially supplied to the data lines 6a in this order or may be supplied to the plurality of data lines 6a adjacent to one another in groups. The scanning line drive circuit 102 line-sequentially supplies the scan signals SC1 to SCm to the scanning lines 3 in a pulsed manner at a predetermined timing.

In the liquid crystal device 100, the TFT 30, being a switching element, is turned on only for a certain period by an input of the scan signals SC1 to SCm and thus, the image signals D1 to Dn supplied from the data lines 6a are written in the pixel electrodes 15 at s predetermined timing. Then, the image signals D1 to Dn having a predetermined level written in the liquid crystal layer 50 via the pixel electrodes 15 are held for a certain period between the pixel electrodes 15 and the counter electrode 23.

To prevent the image signals D1 to Dn held from leaking, the holding capacitor 40 is coupled in parallel with liquid crystal capacitors formed between the pixel electrode 15 and the counter electrode 23. Specifically, the holding capacitor 40 is provided between the drain of the TFT 30 and the common potential line 7. Note that the same potential as the common potential imparted to the common potential line 7 is imparted to the counter electrode 23.

Although the inspection circuit 103 illustrated in FIG. 1 is coupled to the data lines 6a, and is configured to be capable of detecting the image signals described above to confirm operational defects and the like of the liquid crystal device 100 in a manufacturing process of the liquid crystal device 100, this configuration is omitted in the equivalent circuit of FIG. 3.

In addition, the inspection circuit 103 may include a sampling circuit configured to sample the image signals described above and to supply the image signals to the data lines 6a, and a precharge circuit configured to supply precharge signals having a predetermined voltage level to the data lines 6a in advance of the supply of the image signals.

Configuration of a Pixel

Figure 4:
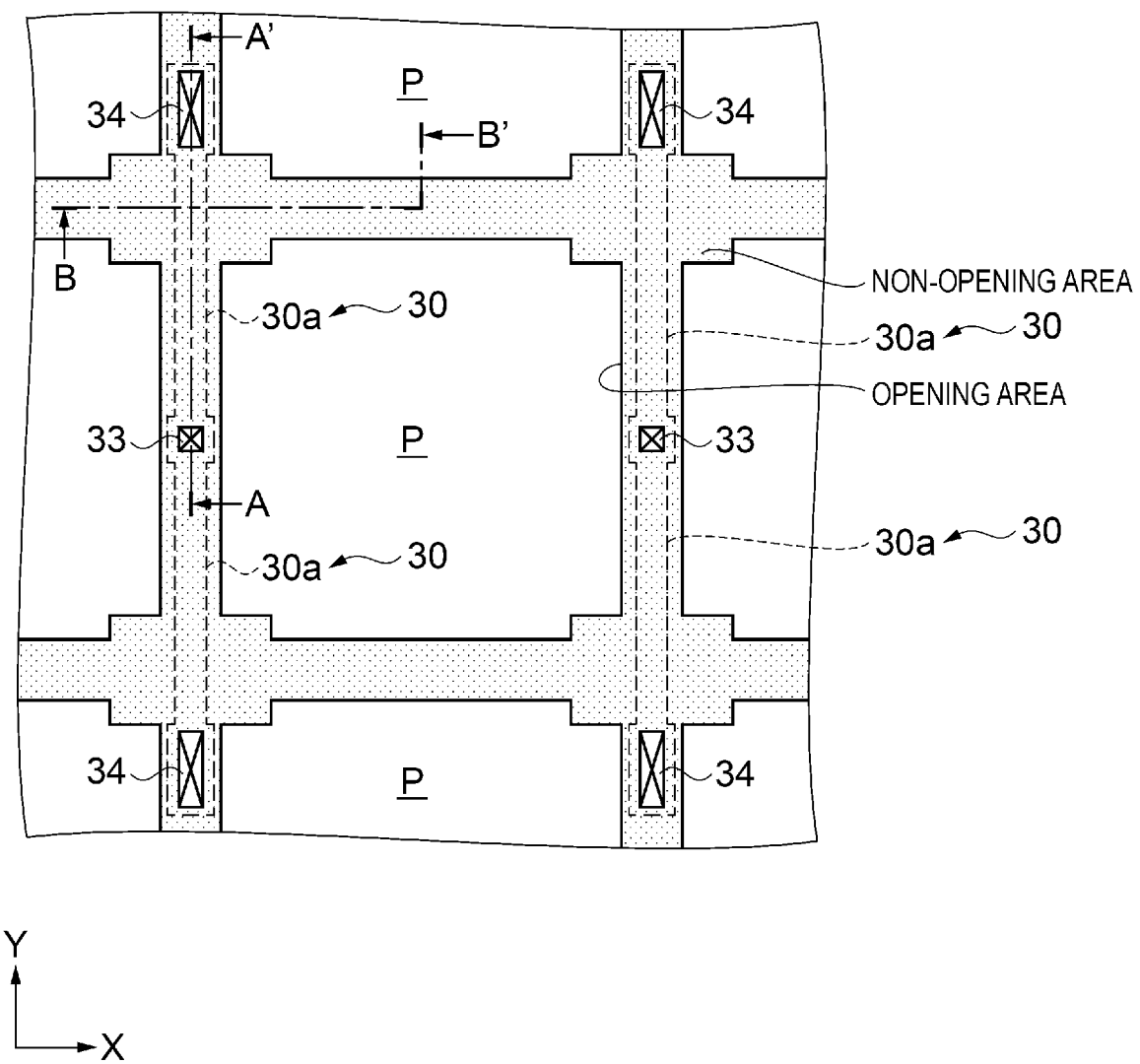
FIG. 4 is a schematic plan view illustrating an arrangement of a pixel.

Next, a configuration of the pixel P in the liquid crystal device 100 will be described with reference to FIG. 4. FIG. 4 is a schematic plan view illustrating arrangement of a pixel. As illustrated in FIG. 4, the pixel P in the liquid crystal device 100 includes an opening area (also referred to as an "opening") having, for example, a substantially quadrangle shape (substantially square shape) in plan view. The opening area is surrounded by non-opening areas (also referred to as "non-openings") each having a light shielding property and extending in the X direction and in the Y direction to be provided in a lattice shape.

In the non-opening areas extending in the X direction, the scanning lines 3 illustrated in FIG. 3 are provided. A conductive member having a light shielding property is used for each scanning line 3, and the non-opening areas partially include the scanning lines 3.

Similarly, in the non-opening areas extending in the Y direction, the data lines 6a illustrated in FIG. 3 are provided. A conductive member having a light shielding property is also used for each data line 6a, and the non-opening areas partially include the scanning lines 3 and the data lines 6a.

Near an intersection of the non-opening areas extending in the X direction and the Y direction, the TFT 30 and the holding capacitor 40 illustrated in FIG. 3 are provided. Although a detailed structure of the pixel P will be described below, the TFT 30 and the holding capacitor 40 are provided near the intersection, and thus widths of the non-opening areas near the intersection are greater than widths of other portions. The TFT 30 and the holding capacitor 40 are provided near the intersection of the non-opening areas each having a light shielding property, and thus light incident on a semiconductor layer 30a of the TFT 30 is blocked and an aperture ratio in the opening area is ensured.

The pixel electrode 15 is provided for each of the pixels P. The pixel electrode 15 has a substantially square shape in plan view, and is provided in the opening area to cause an outer edge of the pixel electrode 15 to overlap the non-opening areas.

The liquid crystal device 100 of this exemplary embodiment is of a transmissive type and, as described above, is configured assuming that light is incident from the element substrate 10 side. As illustrated in FIG. 3, the element substrate 10 is provided with the TFT 30, the pixel electrode 15, and the holding capacitor 40 for each pixel P. In addition, the holding capacitor 40 is configured to include the two capacitance elements 41, 42, and is disposed in the non-opening areas. In other words, the two capacitance elements 41, 42 also constitute a portion of the non-opening areas.

In the exemplary embodiment, the semiconductor layer 30a of the TFT 30 is disposed to extend in the Y direction relative to the intersections of the non-opening areas. In addition, the semiconductor layers 30a of two TFTs 30 associated with the pixels P adjacent to each other in the Y direction share a contact hole 33 achieving the electrical coupling between the respective semiconductor layers 30a and the data lines 6a. A contact hole 34 achieving the electrical coupling between the semiconductor layers 30a and the holding capacitors 40 of two TFTs 30 associated with the pixels P adjacent to each other in the Y direction is independently provided in each of the two TFTs 30. That is, the semiconductor layers 30a of two TFTs 30 associated with the pixels P adjacent to each other in the Y direction are disposed to be connected in the Y direction, and are arranged symmetrically in the Y direction with reference to the contact hole 33. Hereinafter, a detailed structure of the element substrate 10 will be described with reference to the drawings.

Structure of an Element Substrate

Figure 5:
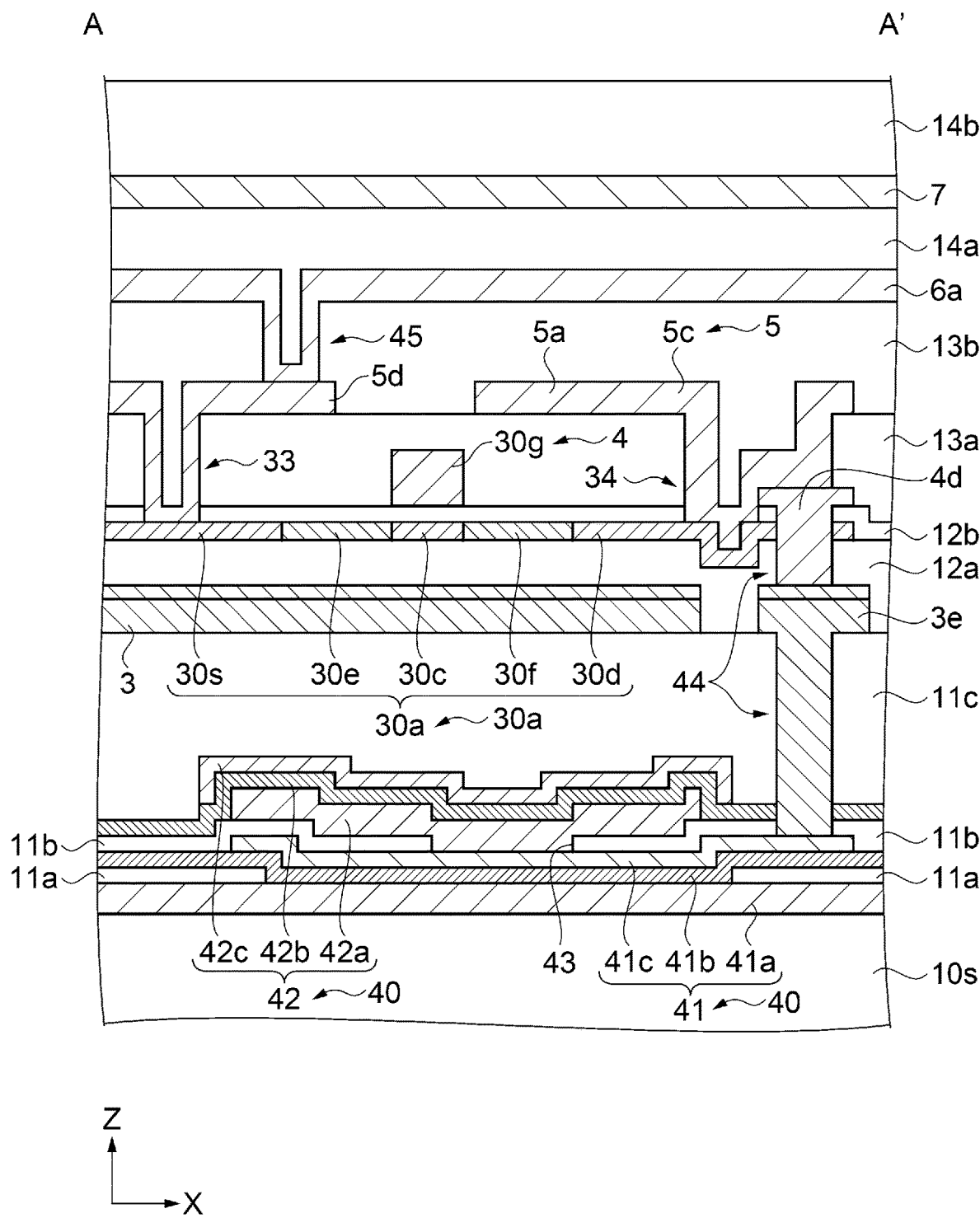
FIG. 5 is a schematic cross-sectional view illustrating a structure of an element substrate taken along line A-A' of FIG. 4.
Figure 6:
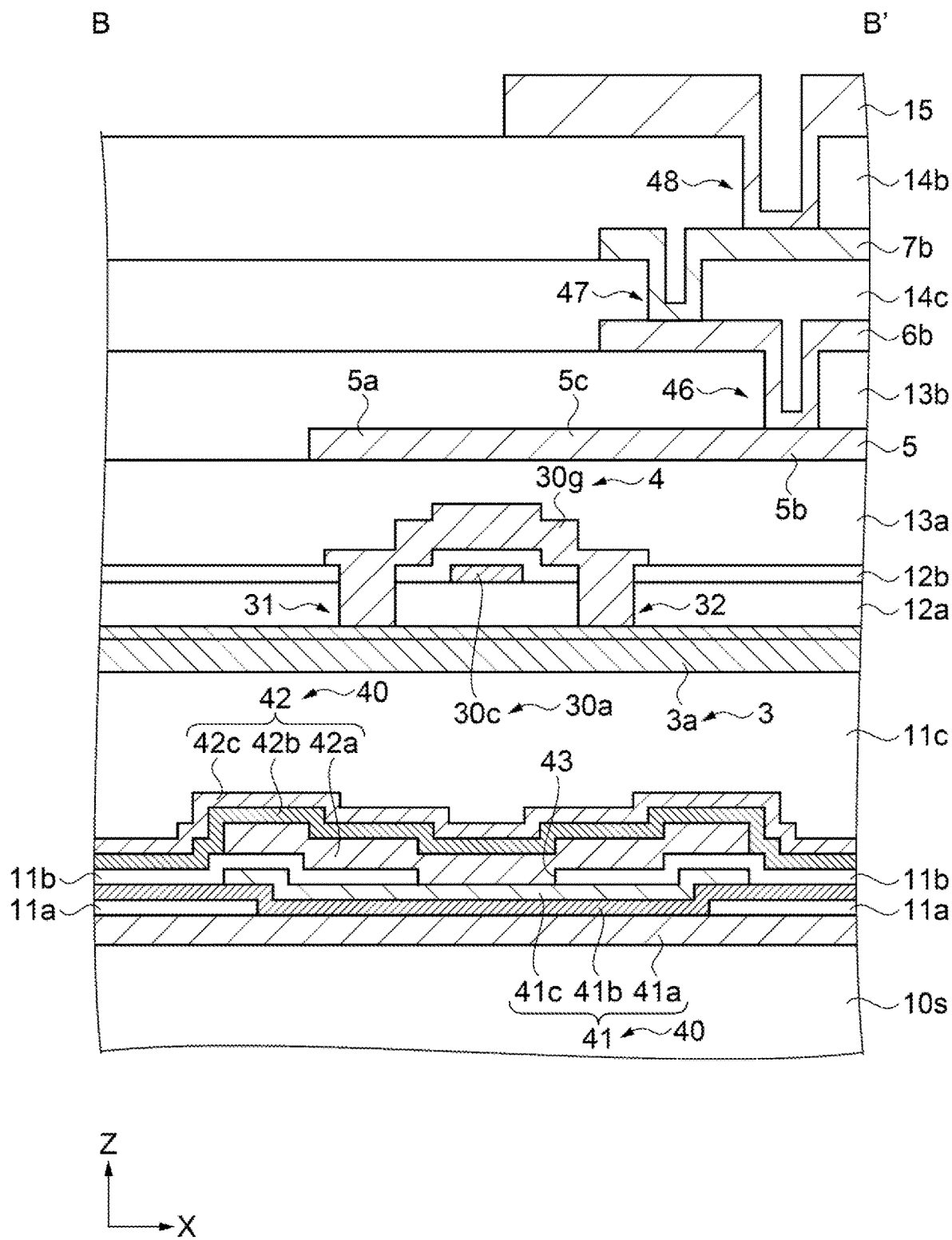
FIG. 6 is a schematic cross-sectional view illustrating the structure of the element substrate taken along line B-B' of FIG. 4.

FIG. 5 is a schematic cross-sectional view illustrating a structure of the element substrate taken along line A-A' of FIG. 4, and FIG. 6 is a schematic cross-sectional view illustrating the structure of the element substrate taken along line B-B' of FIG. 4. Note that line A-A' in FIG. 4 is a line crossing the semiconductor layer 30a from the contact hole 33 across the contact hole 34 in the Y direction, and B-B' line is a line crossing the semiconductor layer 30a in the X direction at the intersection of the non-opening areas.

As illustrated in FIG. 5 and FIG. 6, first the two capacitance elements 41 and 42 constituting the holding capacitor 40 are stacked in this order on the base material 10s. Specifically, a conductive layer covering the base material 10s is formed, and the conductive layer is patterned by photolithography to form a first conductive layer 41a functioning as a first capacitance electrode of the capacitance element 41. Subsequently, for example, an insulating layer having a film thickness from 60 to 100 nanometers (nm) and including silicon oxide is formed to cover the first conductive layer 41a, and the insulating layer is patterned to form an insulating layer 11a having an island shape on the first conductive layer 41a. A first capacitor insulating layer 41b covering the first conductive layer 41a and the insulating layer 11a is formed. Then, a conductive layer covering the first capacitor insulating layer 41b is formed, and the conductive layer is patterned to form a second conductive layer 41c functioning as a second capacitance electrode of the capacitance element 41. The first conductive layer 41a and the second conductive layer 41c sandwiching the first capacitor insulating layer 41b and disposed to face each other constitute the capacitance element 41.

Subsequently, an insulating layer 11b covering the second conductive layer 41c is formed, and a through hole passing through the insulating layer 11b to the second conductive layer 41c is formed. A conductive layer is formed to fill the through hole, and the conductive layer is patterned to form a first contact hole 43 being in contact with the second conductive layer 41c, and a third conductive layer 42a functioning as the third capacitance electrode of the capacitance element 42. The third conductive layer 42a is electrically coupled to the second conductive layer 41c via the first contact hole 43. Next, a second capacitor insulating layer 42b covering the third conductive layer 42a is formed. Then, a conductive layer covering the second capacitor insulating layer 42b is formed, and the conductive layer is patterned to form a fourth conductive layer 42c functioning as a fourth capacitance electrode of the capacitance element 42. The third conductive layer 42a and the fourth conductive layer 42c sandwich the second capacitor insulating layer 42b and disposed to face each other constitute the capacitance element 42.

In this exemplary embodiment, a thin film including a high melting point metal having a melting point exceeding 1000° C. such as tungsten (W), tantalum (Ta), molybdenum (Mo), chromium (Cr), and titanium (Ti) formed by a sputtering method, or including a silicide of the high melting point metal, or a polysilicon film formed by a vacuum CVD method and doped with, for example, phosphorus (P) and imparted with conductivity is used for the conductive layer constituting the first conductive layer 41a. A film thickness of the first conductive layer 41a is from 60 to 100 nm, for example. The conductive layers constituting the second conductive layer 41c and the third conductive layer 42a being in contact with each other via the first contact hole 43 are preferably constituted with the same conductive material. In this exemplary embodiment, a conductive polysilicon film is used. Film thicknesses of the second conductive layer 41c and the third conductive layer 42a are also from 60 to 100 nm, for example. The conductive layers constituting the fourth conductive layer 42c may be a conductive polysilicon film. However, in consideration of a light shielding property, a film of the high melting point metal described above or a silicide film of the high melting point metal is preferably used. In this exemplary embodiment, for example, tungsten silicide (WSi) is used. A film thickness of the fourth conductive layer 42c is also from 60 to 100 nm, for example.

The first capacitor insulating layer 41b and the second capacitor insulating layer 42b are dielectric films, and examples of the dielectric film used include a film formed by using the CVD method or the like such as a metal oxide film such as aluminum oxide, hafnium oxide, and silicon oxide, a metal nitride film such as silicon nitride, or a multilayer film including these metal oxide films and metal nitride films layered one on another. The first capacitor insulating layer 41b and the second capacitor insulating layer 42b of the exemplary embodiment are silicon oxide films each having a film thickness from 15 to 30 nm.

The insulating layer 11b formed between the second conductive layer 41c and the third conductive layer 42a is a silicon oxide film having a film thickness from 60 to 100 nm.

Next, a first interlayer insulating layer 11c including, for example, a silicon oxide film and covering the holding capacitor 40 formed on the base material 10s is formed. Due to covering the holding capacitor 40, irregularities occur on the first interlayer insulating layer 11c, and thus the first interlayer insulating layer 11c is subjected to planarization processing such as Chemical Mechanical Polishing (CMP) processing. An average film thickness of the first interlayer insulating layer 11c obtained after the planarization processing is 1 micrometer (μm), for example.

As illustrated in FIG. 5, a through hole passing through the first interlayer insulating layer 11c, the second capacitor insulating layer 42b, and the insulating layer 11b to the second conductive layer 41c is formed by, for example, dry etching. A conductive layer covering the first interlayer insulating layer 11c is formed to fill the through hole, and the conductive layer is patterned to form the scanning line 3 and a first relay layer 3e that fills the through hole. The scanning line 3 and the first relay layer 3e in this exemplary embodiment have a two-layer structure in which a film including a metal such as tungsten or silicide of the metal is layered on a conductive polysilicon film. That is, in a portion of the first relay layer 3e being in contact with the second conductive layer 41c, the same conductive polysilicon film as the polysilicon film of the second conductive layer 41c is used. Such a portion in which the first relay layer 3e is provided to fill the through hole of the first interlayer insulating layer 11c is a second contact hole 44. Note that a film thickness of the polysilicon film of the scanning line 3 is, for example, 200 nm, and a film thickness of the metal film or the metal silicide film on the polysilicon film is, for example, 100 nm. That is, the film thickness of the scanning line 3 is, for example, 300 nm. The scanning line 3 is an example of a light shielding layer disposed between the substrate and the transistor in the present disclosure.

As illustrated in FIG. 5 and FIG. 6, a second interlayer insulating layer 12a covering the scanning line 3 and the first relay layer 3e is formed. The second interlayer insulation film 12a is formed, for example, by using a silicon oxide film (non-doped silicate glass; NSG film) or a silicon nitride film ($Si_xN_y$ film) in which impurities are intentionally not introduced. The second interlayer insulating layer 12a of this exemplary embodiment is, for example, an NSG film having a film thickness of 400 nm.

Next, the semiconductor layer 30a of the TFT 30 is formed on the second interlayer insulation film 12a. The semiconductor layer 30a in this exemplary embodiment includes a polysilicon film crystallized by subjecting a thin film of amorphous silicon to thermal treatment at 600° C. for 10 hours or more. Then, the semiconductor layer 30a includes a Lightly Doped Drain (LDD) structure including a channel region 30c formed by selectively injecting impurities into the polysilicon film, low concentration impurity regions 30e and 30f being in contact with the channel region 30c, a high concentration impurity region 30s being in contact with the one low concentration impurity region 30e, and a high concentration impurity region 30d being in contact with the other low concentration impurity region 30f. Hereinafter, the low concentration impurity regions 30e and 30f are expressed as LDD regions 30e and 30f. In addition, in this exemplary embodiment, the one high concentration impurity region 30s functions as a source of the TFT 30, and thus, is referred to as the source region 30s, and the other high concentration impurity region 30d functions as a drain for the TFT 30, and thus, is referred to as the drain region 30d. Note that a film thickness of the thin film of amorphous silicon is, for example, 20 nm. In addition, a method for crystallizing the thin film of amorphous silicon is not limited to thermal treatment, and a method including irradiating with a laser beam to achieve crystallization may be used.

Next, a gate insulating layer 12b covering the semiconductor layer 30a is formed. The gate insulating layer 12b is a silicon oxide film having a film thickness of, for example, 30 nm and formed by, for example, the CVD method or the like.

As illustrated in FIG. 5, a through hole passing through the gate insulating layer 12b, the drain region 30d, and the second interlayer insulating layer 12a to the first relay layer 3e is formed. In addition, as illustrated in FIG. 6, two through holes passing through the gate insulating layer 12b and the second interlayer insulating layer 12a to the scanning line 3 are formed at positions sandwiching the semiconductor layer 30a in plan view. A conductive layer covering the gate insulating layer 12b is formed to fill these through holes, and the conductive layer is patterned to form a gate electrode 30g and a second relay layer 4d illustrated in FIG. 5. In addition, a pair of contact holes 31 and 32 coupling the scanning line 3 and the gate electrode 30g illustrated in FIG. 6 are formed. In this exemplary embodiment, the conductive layer constituting the gate electrode 30g, the second relay layer 4d, and the pair of contact holes 31 and 32 include a two-layer structure in which a high melting point metal film such as tungsten having a film thickness of 100 nm or a silicide film of the high melting point metal is layered on a conductive polysilicon film having a film thickness of 200 nm. In this exemplary embodiment, the second contact hole 44 includes the first relay layer 3e and the second relay layer 4d formed to come in contact with the first relay layer 3e. Note that the gate electrode 30g includes a portion of a second scanning line 4 formed to sandwich the gate insulating layer 12b and face the channel region 30c. That is, the second scanning line 4 includes a two-layer structure including different types of conductive layers. The details of the second scanning line 4 will be described below.

As illustrated in FIG. 5 and FIG. 6, a third interlayer insulating layer 13a covering the second scanning line 4 functioning as the gate electrode 30g, and the second relay layer 4d is formed. The third interlayer insulating layer 13a is, for example, a silicon oxide film having a film thickness of 300 nm and formed by the CVD method. As illustrated in FIG. 5, a through hole passing through the third interlayer insulating layer 13a and the gate insulating layer 12b to the source region 30s of the semiconductor layer 30a is formed, and similarly a through hole passing through to the drain region 30d of the semiconductor layer 30a and the second relay layer 4d is formed. The latter through-hole is larger in size in plan view than the former through hole. A conductive layer covering interiors of such two through holes and covering the third interlayer insulating layer 13a is formed, and the conductive layer is patterned to form a source electrode 5d, the contact hole 33, a drain electrode 5c, and the contact hole 34. The source electrode 5d is coupled to the source region 30s via the contact hole 33. The drain electrode 5c is coupled to the drain region 30d via the contact hole 34. Note that the drain electrode 5c is a portion of the relay electrode 5 described below, and the relay electrode 5 is an example of an electrode being in contact with the semiconductor layer of the transistor according to the present disclosure.

A fourth interlayer insulating layer 13b covering a relay electrode 5 including the source electrode 5d and the drain electrode 5c is formed. The fourth interlayer insulating layer 13b is, for example, a silicon oxide film formed by the CVD method. Since the fourth interlayer insulating layer 13b covers the source electrode 5d and the relay electrode 5, irregularities occur in a surface, and thus the fourth interlayer insulating layer 13b is subjected to planarization processing such as CMP processing. An average film thickness of the fourth interlayer insulating film 13b obtained after the planarization processing is, for example, 800 nm.

As illustrated in FIG. 5, a through hole passing through the fourth interlayer insulating layer 13b to the source electrode 5d is formed. As illustrated in FIG. 6, similarly, a through hole passing through the fourth interlayer insulating layer 13b to the relay electrode 5 is formed. A conductive layer covering inner sides of such through holes and covering the fourth interlayer insulating layer 13b is formed, and the conductive layer is patterned to form the data line 6a, a contact hole 45, a relay electrode 6b, and a contact hole 46. The data line 6a is coupled to the source electrode 5d via the contact hole 45. A relay electrode 6b is coupled to the relay electrode 5 via the contact hole 46. As described above, since the relay electrode 5 includes the drain electrode 5c, the relay electrode 6b is coupled to the drain electrode 5c via the contact hole 46.

As illustrated in FIG. 5 and FIG. 6, a fifth interlayer insulating layer 14a covering the data line 6a and the relay electrode 6b is formed. The fifth interlayer insulating layer 14a is, for example, a silicon oxide film formed by the CVD method. Since the fifth interlayer insulating layer 14a covers the data line 6a and the relay electrode 6b, irregularities occur in a surface, and thus the fifth interlayer insulating layer 14a is subjected to planarization processing such as CMP processing. An average film thickness of the fifth interlayer insulating film 14a obtained after the planarization processing is, for example, 800 nm. As illustrated in FIG. 6, a through hole passing through the fifth interlayer insulating layer 14a to the relay electrode 6b is formed. A conductive layer covering an inner side of this through hole and covering the fifth interlayer insulating layer 14a is formed, and the conductive layer is patterned to form the common potential line 7 illustrated in FIG. 5, and a relay electrode 7b and a contact hole 47 illustrated in FIG. 6. The relay electrode 7b is coupled to the relay electrode 6b via the contact hole 47. The common potential line 7 imparted a common potential is disposed between the data line 6a and the pixel electrode 15 on the base material 10s, and thus it is possible to prevent a high potential image signal imparted to the data line 6a from directly affecting the pixel electrode 15. That is, the common potential line 7 also functions as a shielding layer with respect to the data line 6a.

As illustrated in FIG. 5 and FIG. 6, a sixth interlayer insulating layer 14b covering the common potential line 7 and the relay electrode 7b is formed. In addition, the sixth interlayer insulating layer 14b is also, for example, a silicon oxide film formed by the CVD method. Since the sixth interlayer insulating layer 14b covers the common potential line 7 and the relay electrode 7b, irregularities occur in a surface, and thus the sixth interlayer insulating layer 14b is subjected to planarization processing such as CMP processing. An average film thickness of the sixth interlayer insulating film 14b obtained after the planarization processing is, for example, 800 nm. As illustrated in FIG. 6, a through hole passing through the sixth interlayer insulating layer 14b to the relay electrode 7b is formed. A transparent conductive layer such as an ITO film covering an inner side of this through hole and covering the sixth interlayer insulating layer 14b is formed, and the transparent conductive layer is patterned to form the pixel electrode 15 and a contact hole 48 illustrated in FIG. 6. The pixel electrode 15 is coupled to the relay electrode 7b via the contact hole 48.

That is, the pixel electrode 15 is electrically coupled to the drain electrode 5c of the TFT 30 via the contact hole 48, the relay electrode 7b, the contact hole 47, the relay electrode 6b, and the contact hole 46. The data line 6a is electrically coupled to the source electrode 5d of the TFT 30 via the contact hole 45.

Of the conductive layers (capacitance electrodes) constituting the holding capacitor 40, the second conductive layer 41c and the third conductive layer 42a are electrically coupled via the first contact hole 43. In addition, the second conductive layer 41c is electrically coupled to the drain electrode 5c of the TFT 30 via the second contact hole 44 including the first relay layer 3e and the second relay layer 4d. Although not illustrated in FIG. 5 and FIG. 6, of the conductive layers (capacitive electrodes) constituting the holding capacitor 40, the first conductive layer 41a and the fourth conductive layer 42c are electrically coupled to the common potential line 7 and are imparted a common potential. In other words, the first conductive layer 41a and the fourth conductive layer 42c function as capacitance wiring imparted a common potential.

As illustrated in FIG. 5 and FIG. 6, on the base material 10s of the element substrate 10, in addition to the four conductive layers of the first conductive layer 41a, the second conductive layer 41c, the third conductive layer 42a, and the fourth conductive layer 42c constituting the holding capacitor 40, the scanning line 3, the semiconductor layer 30a, the second scanning line 4 functioning as the gate electrode 30g, the drain electrode 5c and the source electrode 5d, the data line 6a, the common potential line 7, and the pixel electrode 15 are provided in this order. That is, the element substrate 10 includes a plurality of wiring layers provided with various kinds of signal wiring and electrodes, and various conductive layers in accordance with the electrical coupling to the semiconductor layer 30a of the TFT 30.

Wiring Layer of Element Substrate

Figure 7:
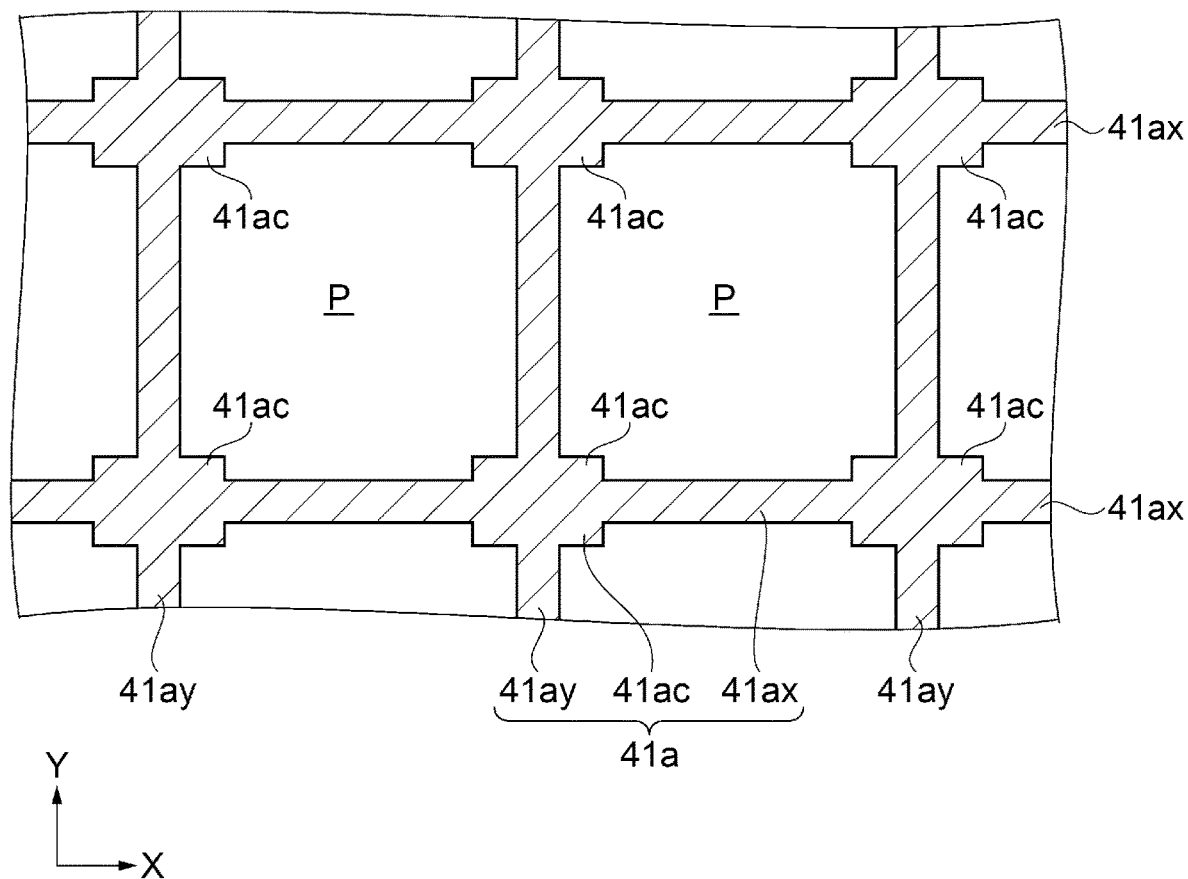
FIG. 7 is a schematic plan view illustrating an arrangement of a first conductive layer of a holding capacitor.
Figure 8:
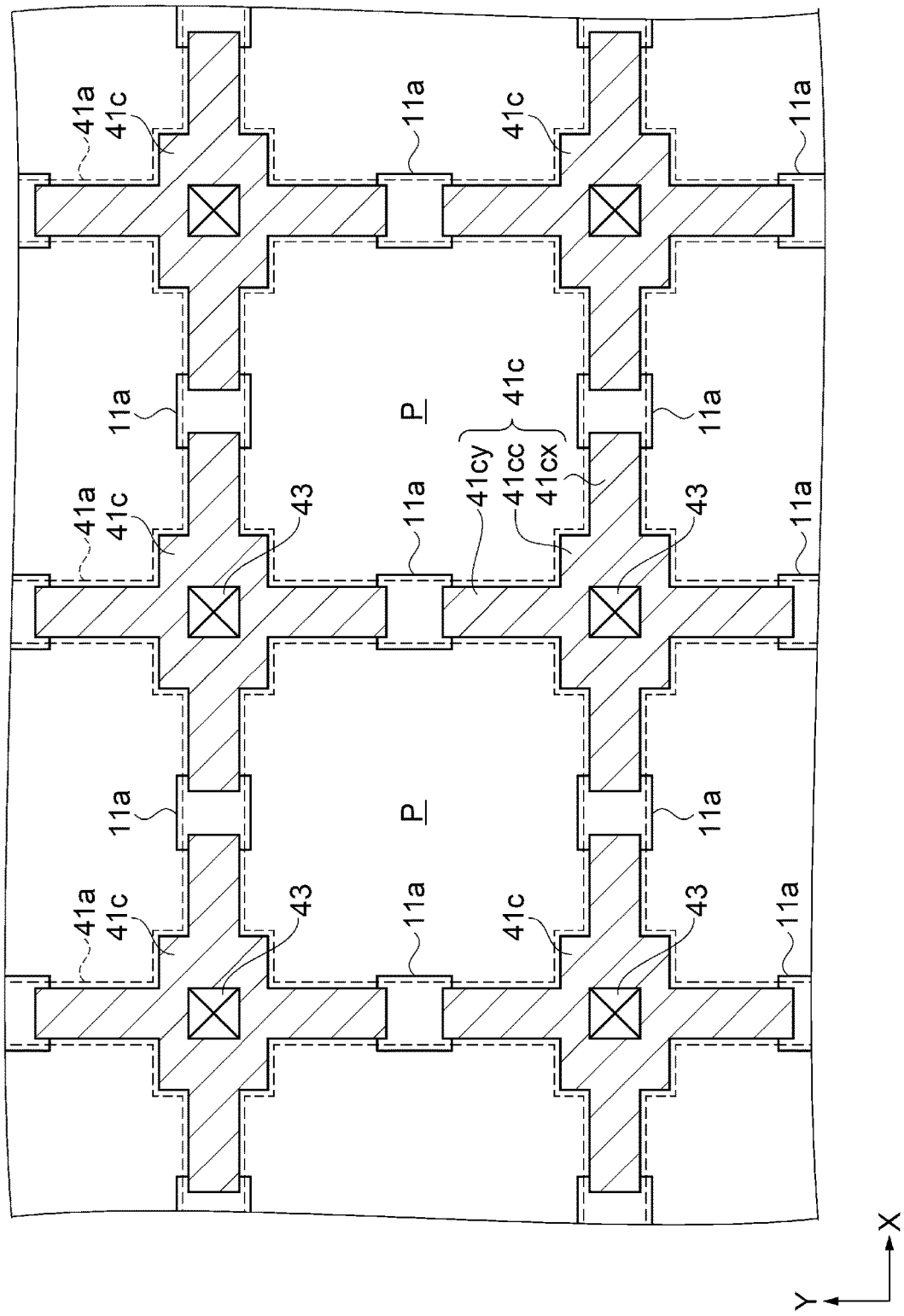
FIG. 8 is a schematic plan view illustrating an arrangement of a second conductive layer of the holding capacitor.
Figure 9:
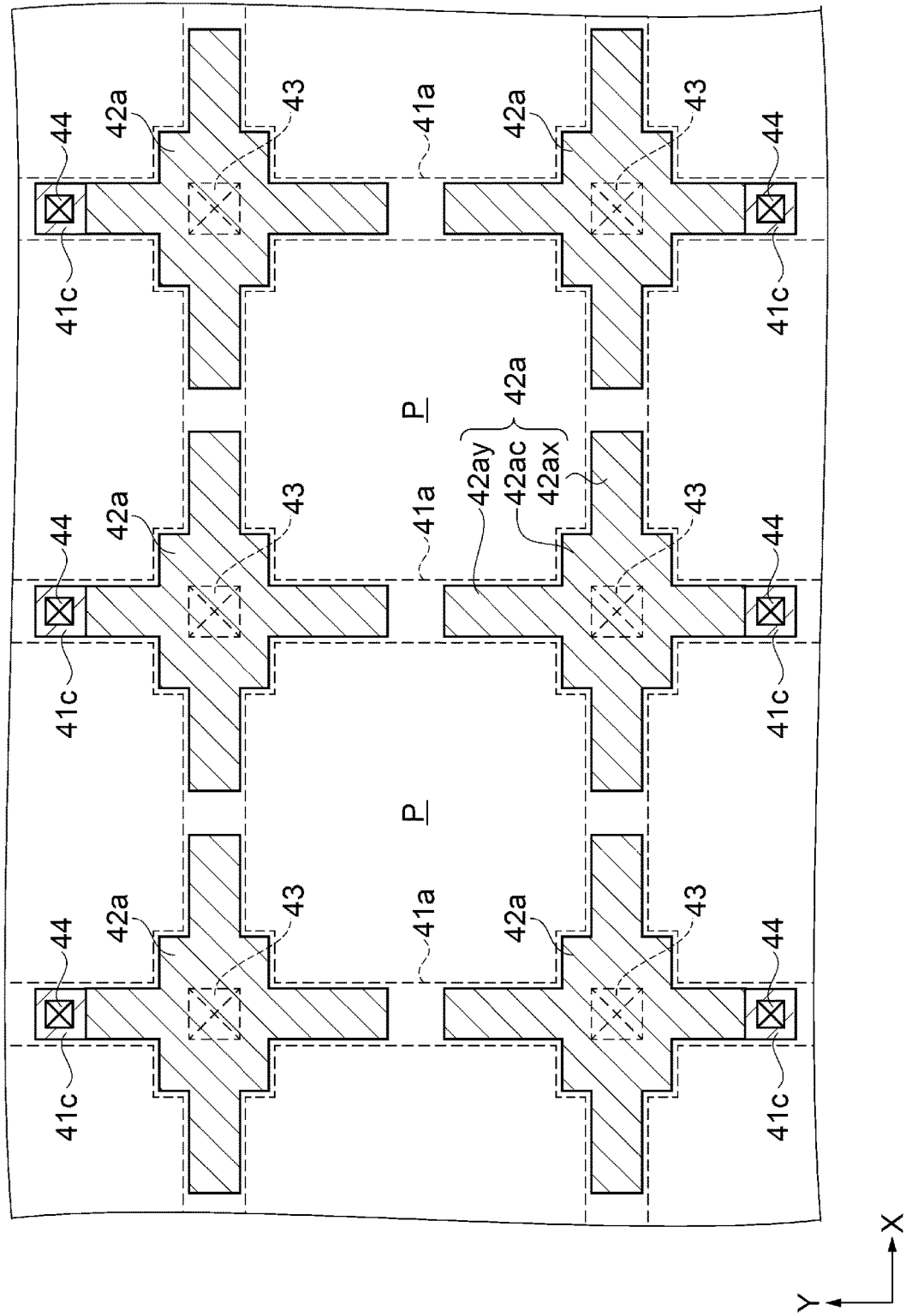
FIG. 9 is a schematic plan view illustrating an arrangement of a third conductive layer of the holding capacitor.
Figure 10:
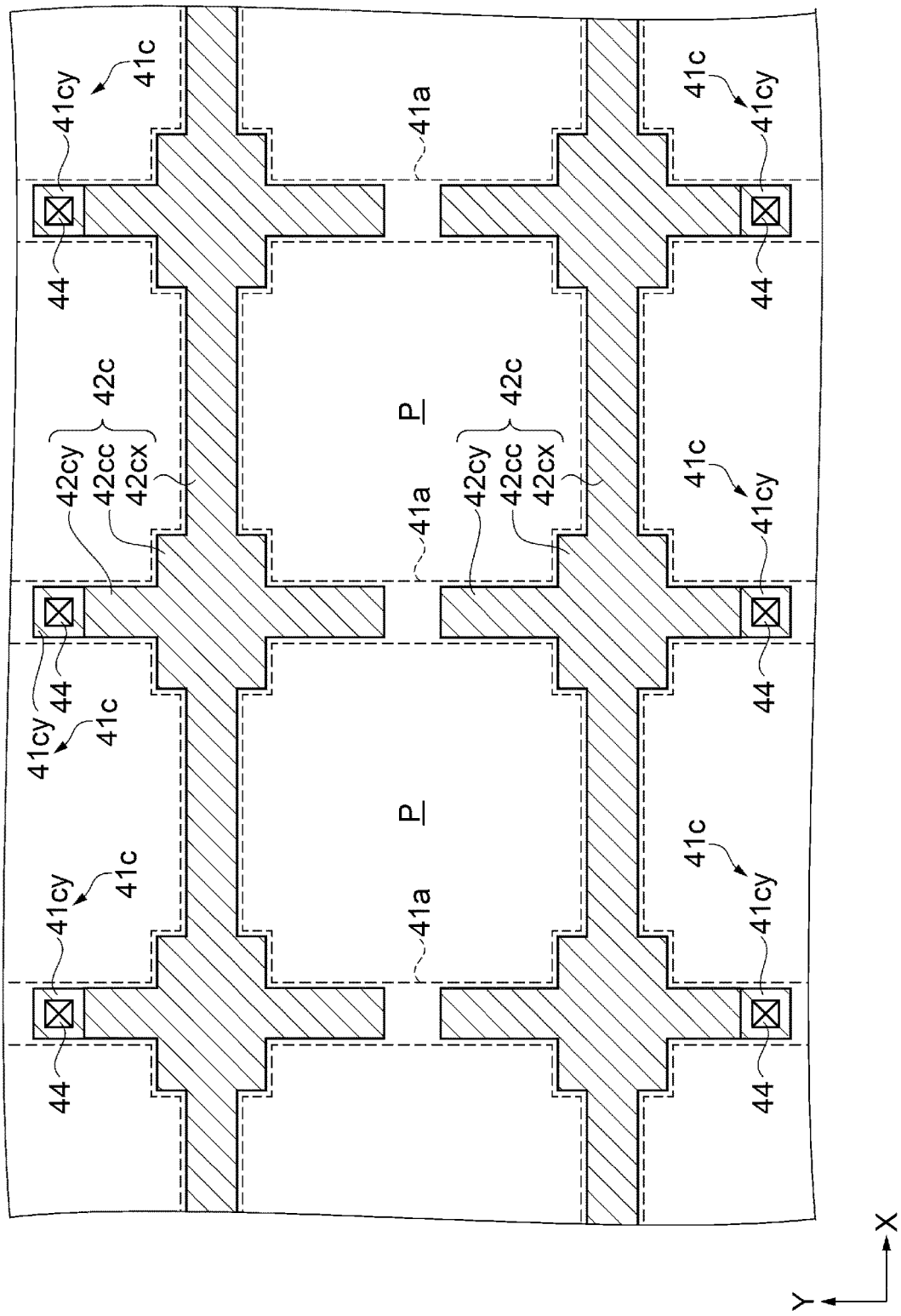
FIG. 10 is a schematic plan view illustrating an arrangement of a fourth conductive layer of the holding capacitor.
Figure 11:
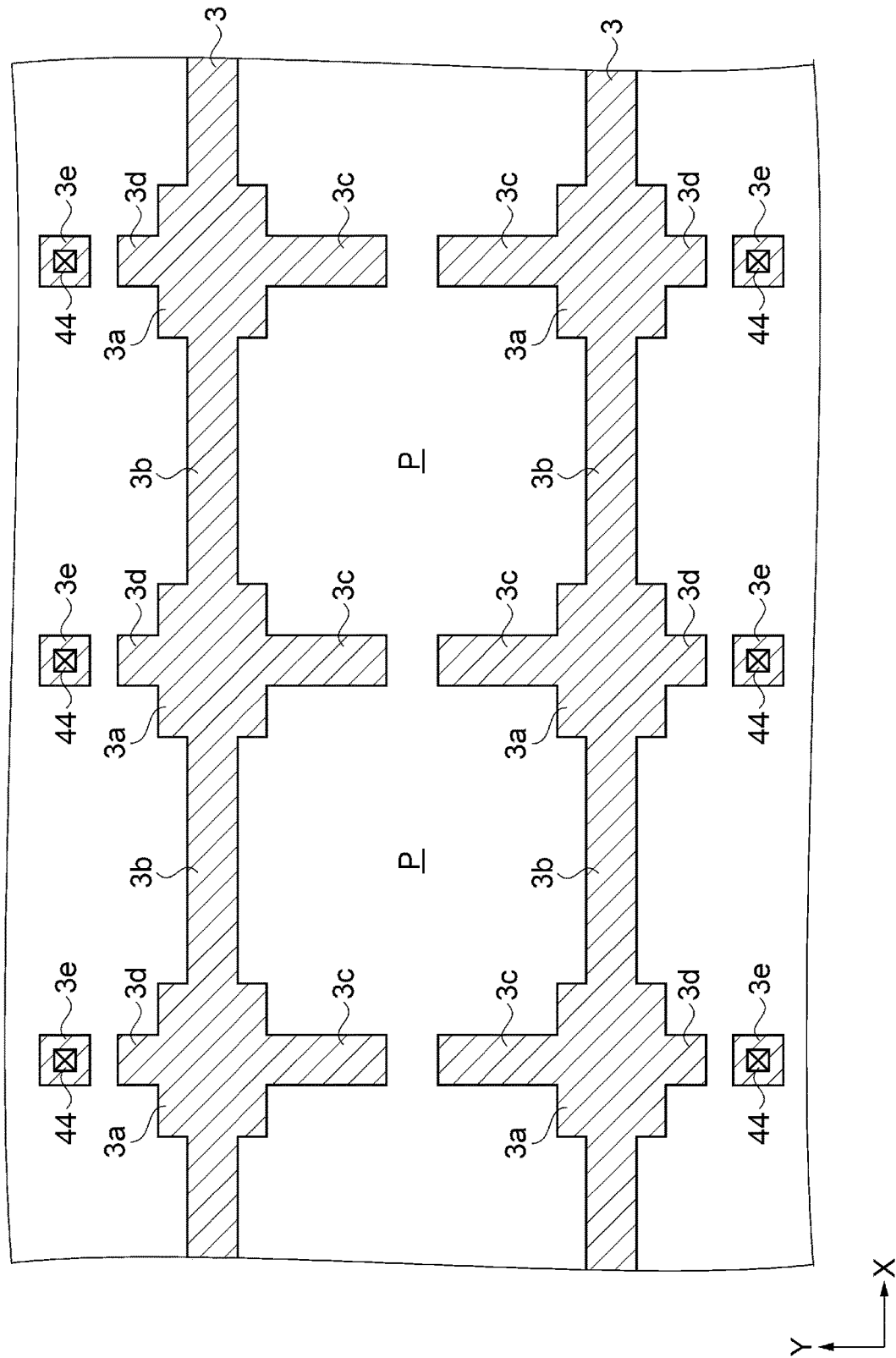
FIG. 11 is a schematic plan view illustrating an arrangement of a scanning line.
Figure 12:
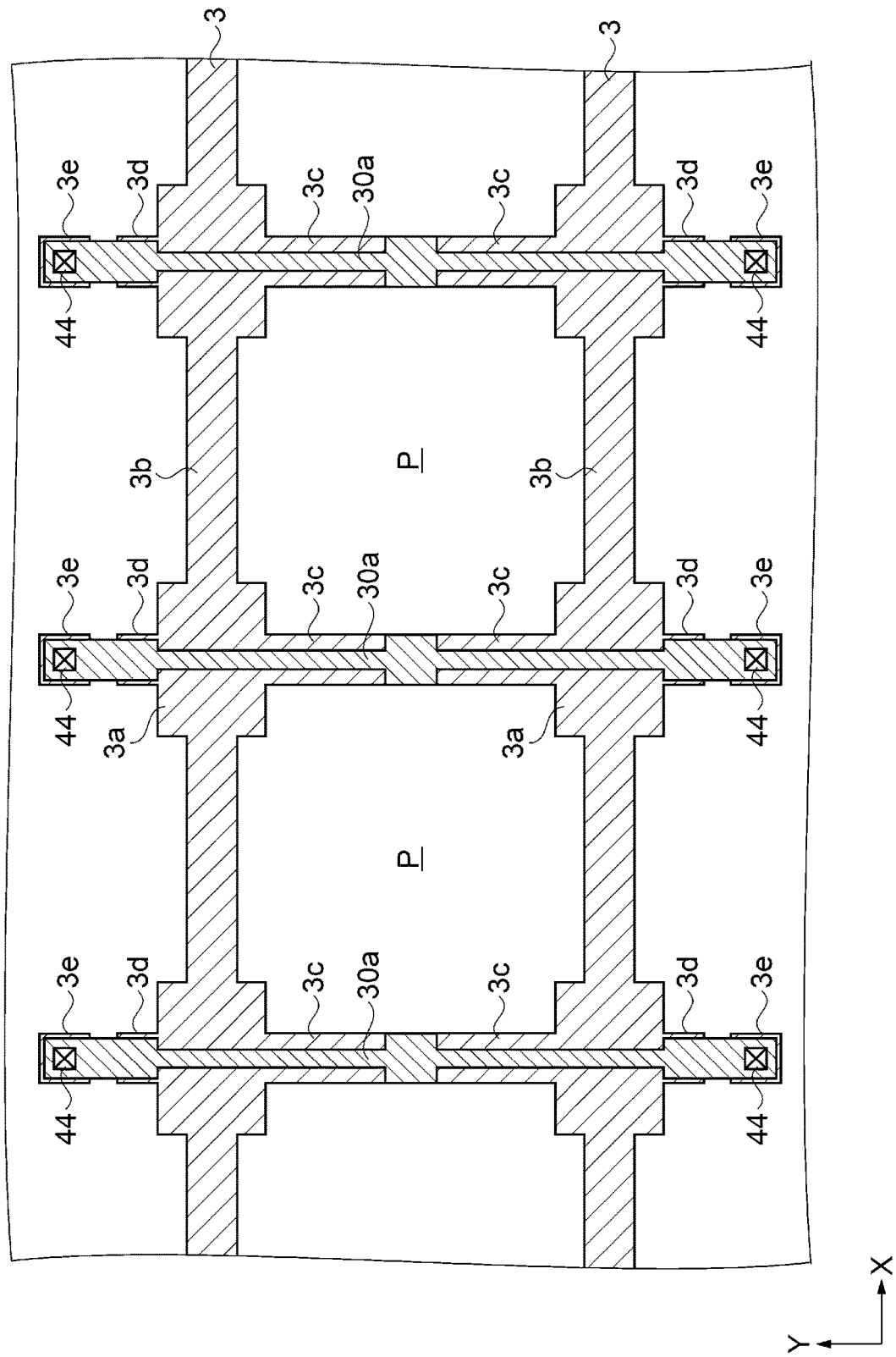
FIG. 12 is a schematic plan view illustrating an arrangement of a semiconductor layer.
Figure 13:
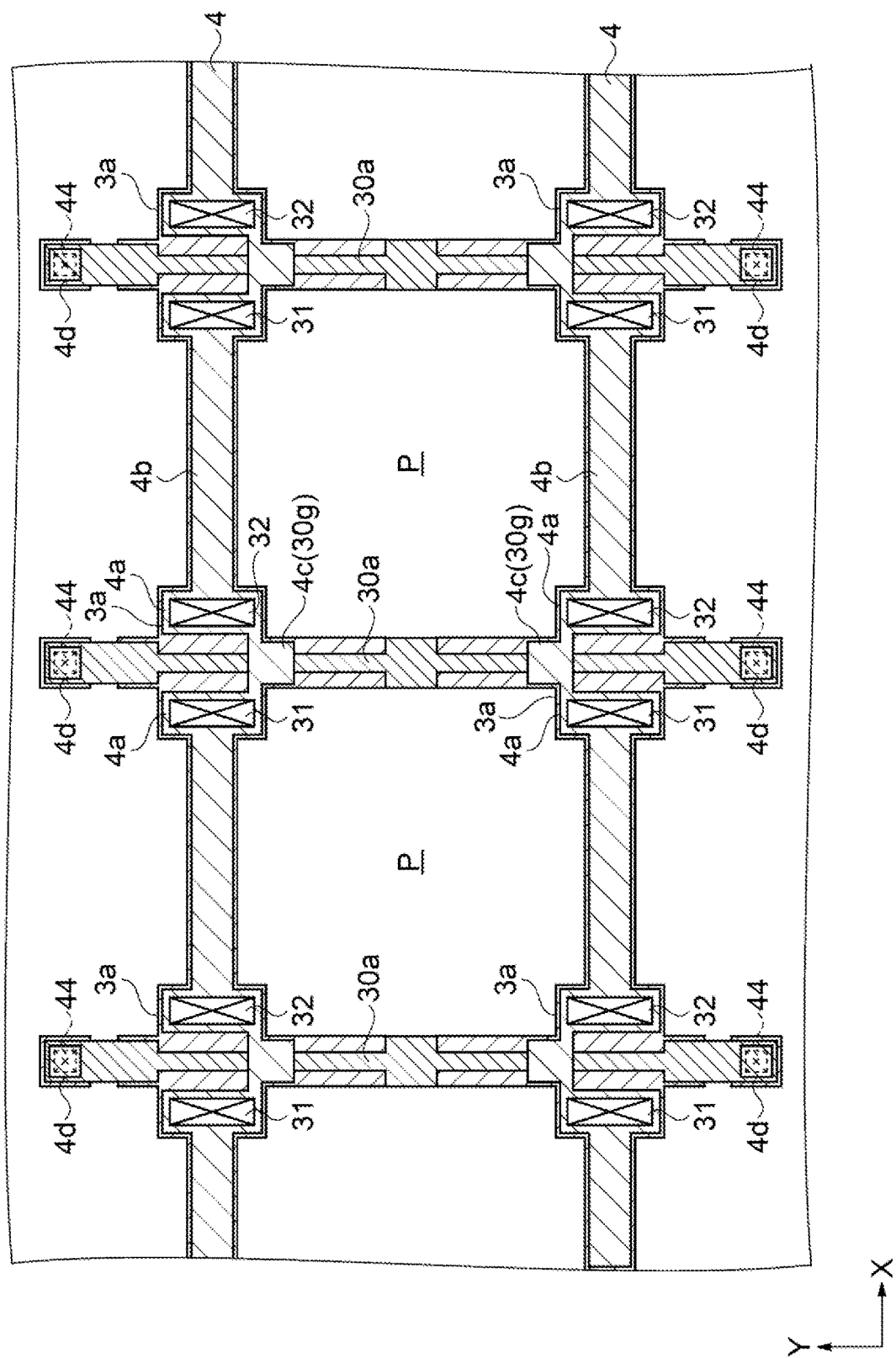
FIG. 13 is a schematic plan view illustrating an arrangement of a second scanning line.
Figure 14:
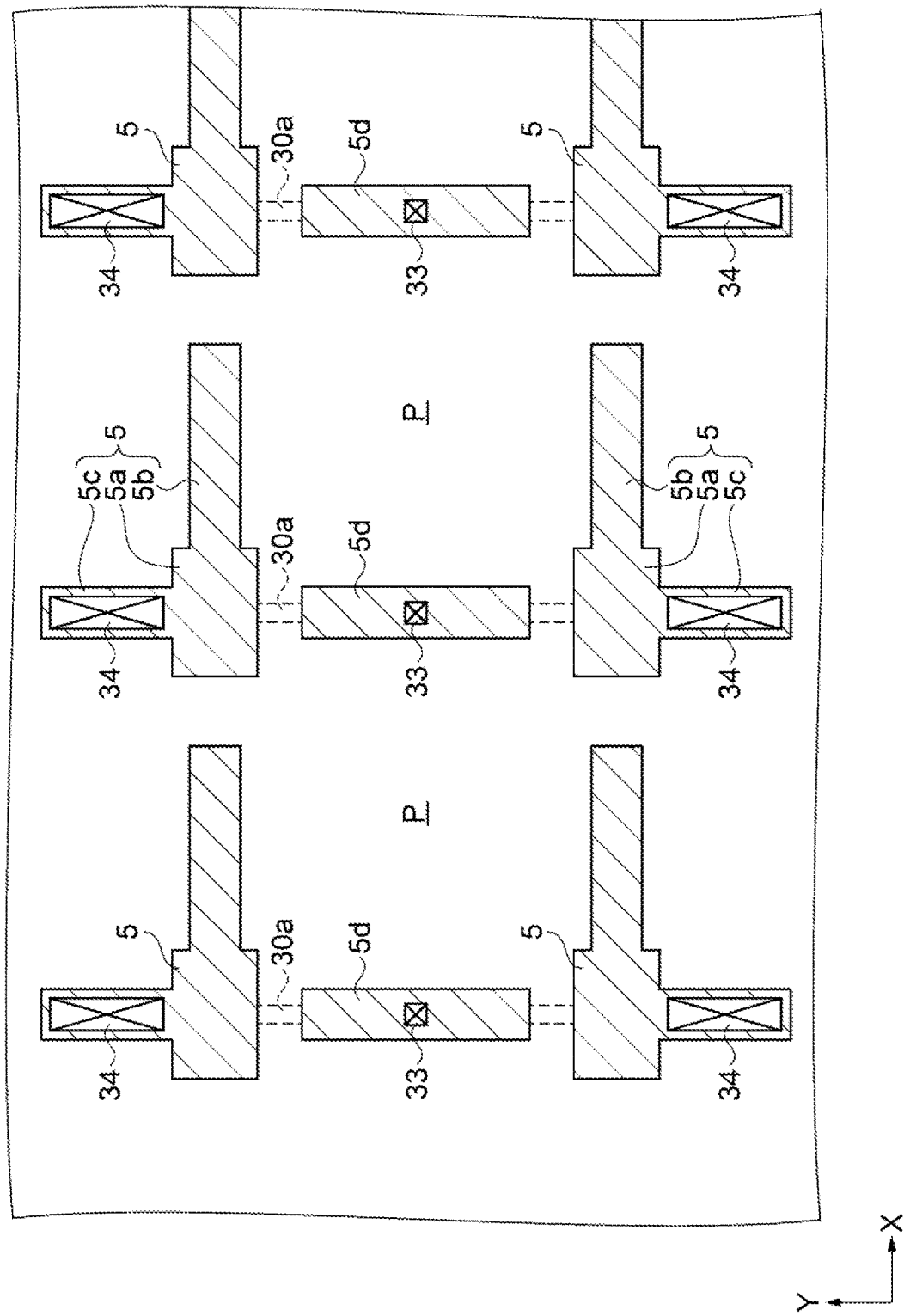
FIG. 14 is a schematic plan view illustrating an arrangement of a source electrode and a relay electrode.
Figure 15:
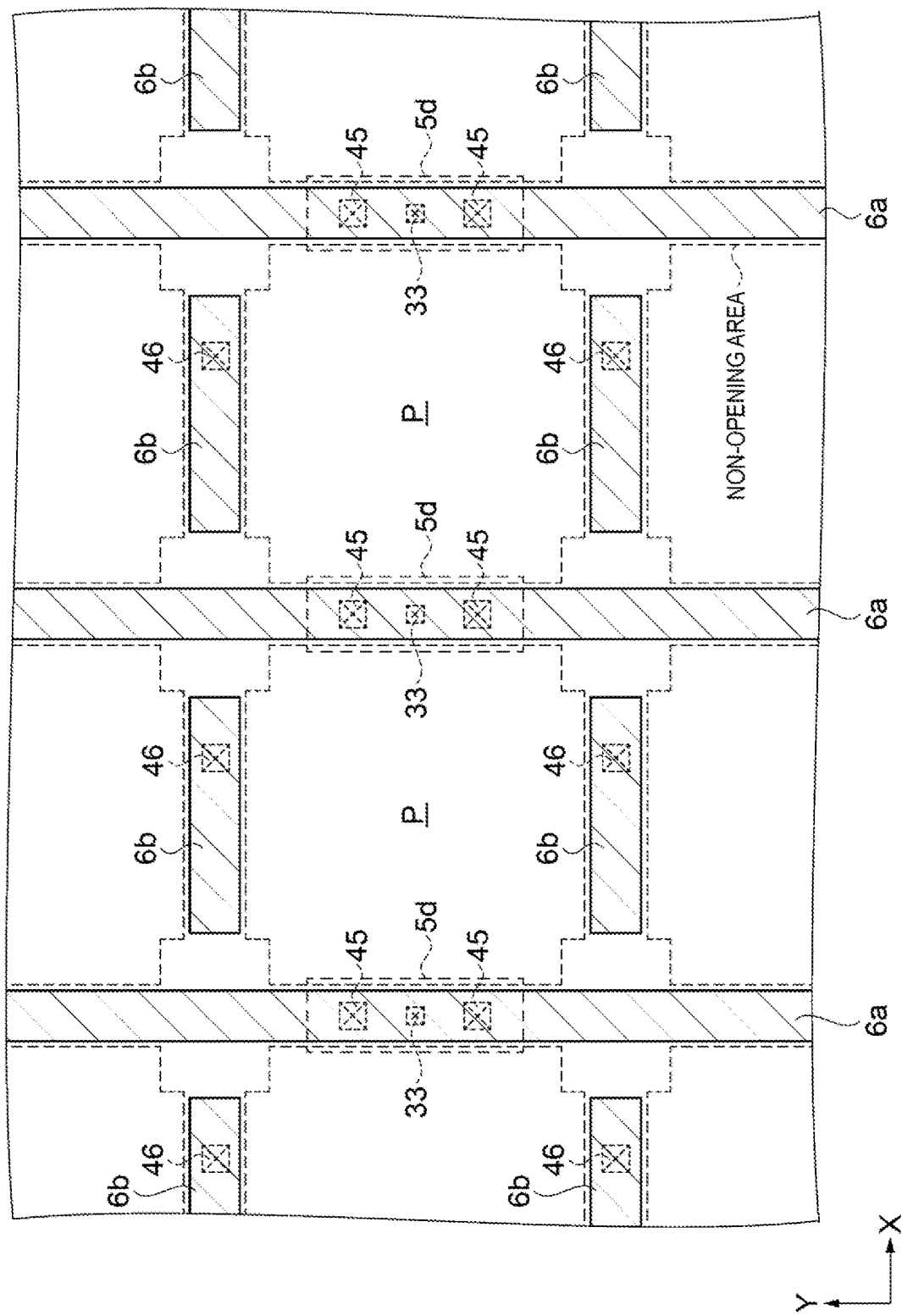
FIG. 15 is a schematic plan view illustrating an arrangement of a data line.
Figure 16:
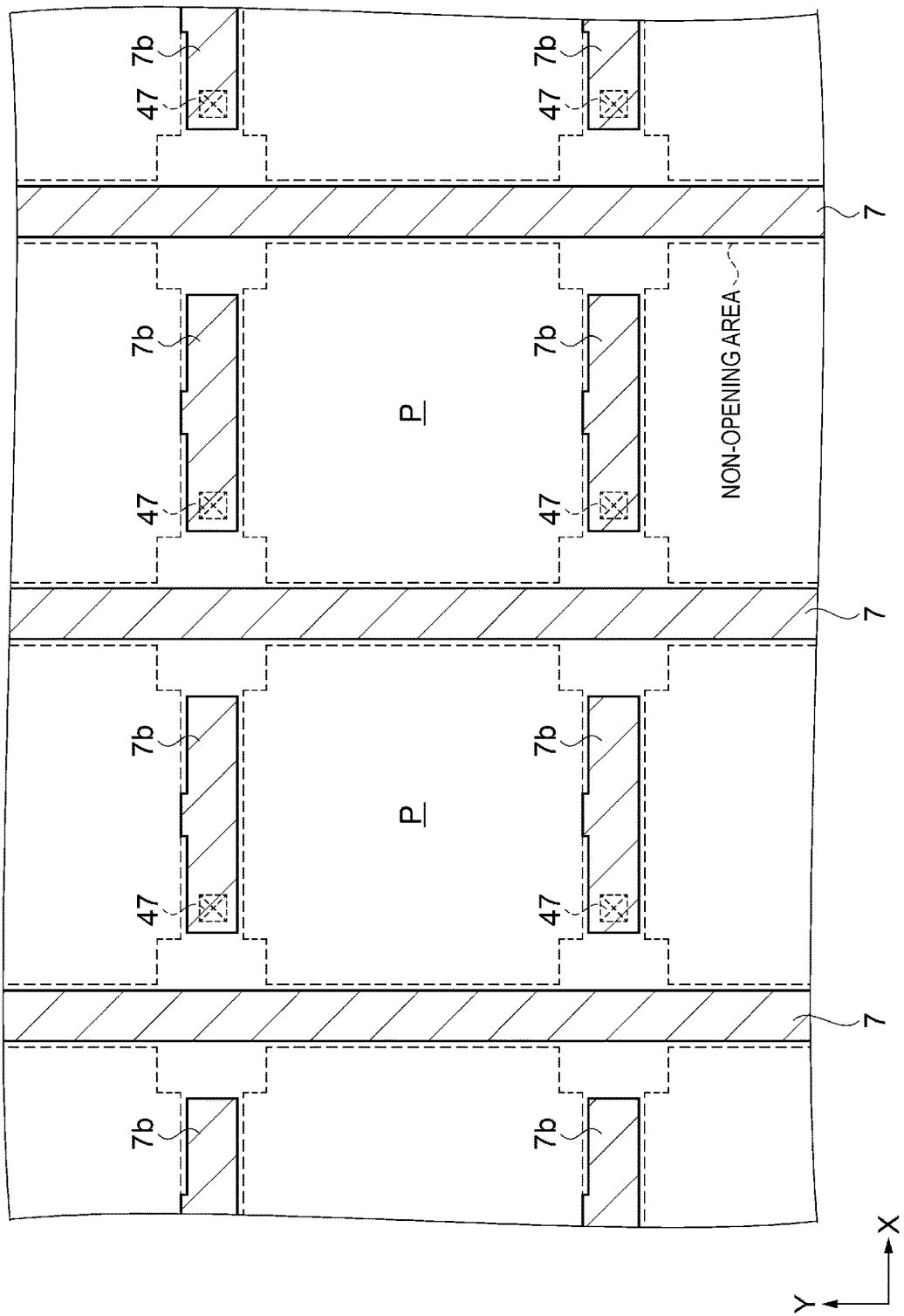
FIG. 16 is a schematic plan view illustrating an arrangement of a common potential line.
Figure 17:
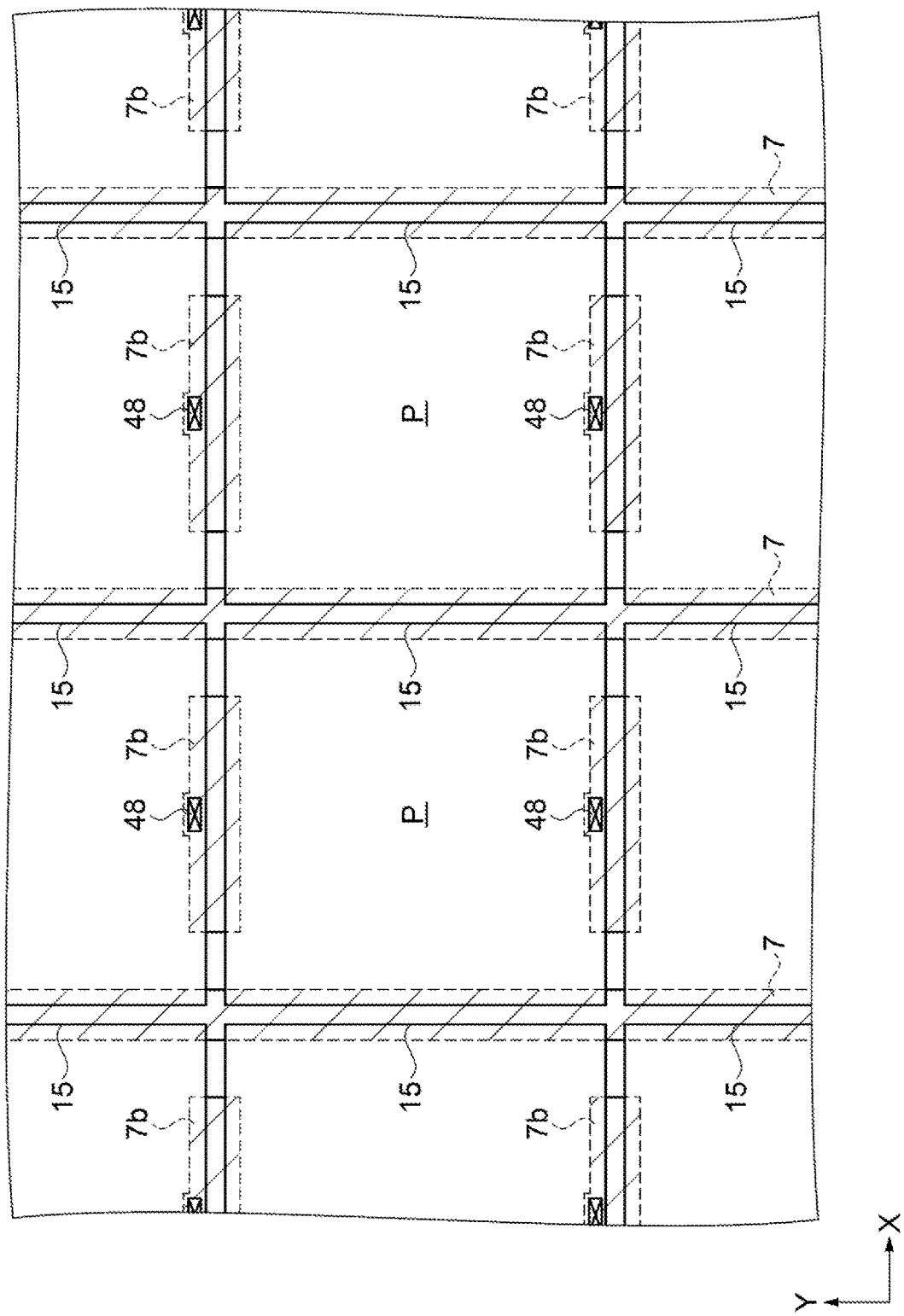
FIG. 17 is a schematic plan view illustrating an arrangement of a pixel electrode.

Next, an arrangement of an electrical configuration of each of the plurality of wiring layers in the element substrate 10 will be described with reference to FIG. 7 to FIG. 17. FIG. 7 to FIG. 17 are schematic plan views illustrating an arrangement of electrical configurations in respective wiring layers of the element substrate. Specifically, FIG. 7 is a schematic plan view illustrating an arrangement of the first conductive layer of the holding capacitor, FIG. 8 is a schematic plan view illustrating an arrangement of the second conductive layer of the holding capacitor, FIG. 9 is a schematic plan view illustrating an arrangement of the third conductive layer of the holding capacitor, and FIG. 10 is a schematic plan view illustrating an arrangement of the fourth conductive layer of the holding capacitor. FIG. 11 is a schematic plan view illustrating an arrangement of the scanning line, FIG. 12 is a schematic plan view illustrating an arrangement of the semiconductor layer, FIG. 13 is a schematic plan view illustrating an arrangement of the second scanning line, and FIG. 14 is a schematic plan view illustrating an arrangement of the source electrode and the relay electrode. FIG. 15 is a schematic plan view illustrating an arrangement of the data line, FIG. 16 is a schematic plan view illustrating an arrangement of the common potential line, FIG. 17 is a schematic plan view illustrating an arrangement of the pixel electrode.

As illustrated in FIG. 7, the first conductive layer 41a includes a first body portion 41ac, a first portion 41ax extending from the first body portion 41ac in the X direction being a first direction, and a second portion 01ay extending from the first body portion 41ac in the Y direction being a second direction intersecting the first direction. Such a first conductive layer 41a is disposed in the non-opening areas surrounding the pixel P illustrated in FIG. 4 in a lattice shape. The first body portion 41ac of the first conductive layer 41a is disposed at the intersection of the non-opening areas, and has a width greater than each of the widths of the first portion 41ax extending in the X direction and the second portion 01ay extending in the Y direction. In addition, the first conductive layer 41a is disposed over the display region E illustrated in FIG. 1, and the first portion 41ax and the second portion 01ay are drawn to an outer side of the display region E to function as capacitance wiring, and a common potential is imparted as described above.

As illustrated in FIG. 8, the second conductive layer 41c includes a second body portion 41cc, a first protruding portion 41cx protruding from the second body portion 41cc in the X direction being the first direction, and a second protruding portion 41cy protruding from the second body portion 41cc in the Y direction being the second direction intersecting the first direction. Such a second conductive layer 41c is also disposed in the non-opening areas surrounding the pixel P illustrated in FIG. 4 in a lattice shape. The second body portion 41cc of the second conductive layer 41c is disposed at the intersection of the non-opening areas, and has a large width compared to each of the widths of the first protruding portion 41cx protruding in the X direction and the second protruding portion 41cy protruding in the Y direction. Such a second conductive layer 41c has a cross shape in plan view, and is disposed at each of the four corners of the pixel P, but is provided electrically independently in correspondence with one pixel P. Thus, to ensure that the second conductive layer 41c is electrically independent, the insulating layer 11a is provided on the first conductive layer 41a, as illustrated in FIG. 5, from the perspective of preventing an electrical short-circuit with the first conductive layer 41a positioned in a lower layer of the second conductive layer 41c when the conductive layer constituting the second conductive layer 41c is patterned. Specifically, as illustrated in FIG. 8, the insulating layer 11a is disposed to overlap an end portion of the first protruding portion 41cx of the second conductive layer 41c adjacent in the X direction, in plan view. In addition, the insulating layer 11a is disposed to overlap an end portion of the second protruding portion 41cy of the second conductive layer 41c adjacent in the Y direction, in plan view.

The first contact hole 43 for achieving the electrical coupling to the third conductive layer 42a is disposed in the center in the X direction and the Y direction of the second body portion 41cc of the second conductive layer 41c.

As illustrated in FIG. 9, the third conductive layer 42a includes a third body portion 42ac, a third protruding portion 42ax protruding from the third body portion 42ac in the X direction, and a fourth protruding portion 42ay protruding from the third body portion 42ac in the Y direction. Such a third conductive layer 42a is also disposed in the non-opening areas surrounding the pixel P illustrated in FIG. 4 in a lattice shape. The third body portion 42ac of the third conductive layer 42a is disposed at the intersection of the non-opening areas, and has a large width as compared to each of the widths of the third protruding portion 42ax protruding in the X direction and the fourth protruding portion 42ay protruding in the Y direction. Such a third conductive layer 42a has a cross shape in plan view, and is disposed at each of the four corners of the pixel P, but is provided electrically independently in correspondence with one pixel P. The third conductive layer 42a is electrically coupled to the second conductive layer 41c positioned in a lower layer by the first contact hole 43 provided at a position where the first contact hole 43 overlaps the third body portion 42ac in plan view. In addition, a length in the Y direction of the fourth protruding portion 42ay protruding in the Y direction of the third conductive layer 42a is short as compared to a length of the second protruding portion 41cy protruding in the Y direction of the second conductive layer 41c positioned in a lower layer. One end portion of the second protruding portion 41cy of the second conductive layer 41c is disposed to protrude from one end portion of the fourth protruding portion 42ay of the third conductive layer 42a in the Y direction, and the second contact hole 44 electrically coupled to the second conductive layer 41c and the semiconductor layer 30a of the TFT 30 is disposed in the one end portion of the second protruding portion 41cy. Note that when the conductive layer constituting the third conductive layer 42a is patterned to make the third conductive layer 42a electrically independent, the insulating layer 11b (refer to FIG. 5) is provided to cover the second conductive layer 41c positioned in advance in a lower layer of the third conductive layer 42a.

As illustrated in FIG. 10, the fourth conductive layer 42c includes a fourth body portion 42cc, a third portion 42cx extending from the fourth body portion 42cc in the X direction, and a fifth protruding portion 42cy protruding from the fourth body portion 42cc in the Y direction. Such a fourth conductive layer 42c is also disposed in the non-opening areas surrounding the pixel P illustrated in FIG. 4 in a lattice shape. The fourth body portion 42cc of the fourth conductive layer 42c is disposed at the intersection of the non-opening areas, and has a large width as compared to each of widths of the third portion 42cx extending in the X direction and the fifth protruding portion 42cy protruding in the Y direction. The third portion 42cx is disposed across the plurality of pixels P arranged in the X direction. A length in the Y direction of the fifth protruding portion 42cy is substantially the same as a length of the fourth protruding portion 42ay of the third conductive layer 42a described above and positioned in a lower layer. Thus, a short-circuit between the second contact hole 44 and the fourth conductive layer 42c disposed at the one end portion of the second protruding portion 41cy of the second conductive layer 41c is prevented. Such a fourth conductive layer 42c is symmetrically disposed in the Y direction across the plurality of pixels P arranged in the X direction.

As illustrated in FIG. 11, the scanning line 3 being an example of the light shielding layer of the present disclosure includes a fifth body portion 3a, a fourth portion 3b extending from the fifth body portion 3a in the X direction, and sixth protruding portions 3c and 3d protruding from the fifth body portion 3a in the Y direction. Such a scanning line 3 is also disposed in the non-opening areas surrounding the pixel P illustrated in FIG. 4 in a lattice shape. The fifth body portion 3a of the scanning line 3 is disposed at the intersection of the non-opening areas, and has a large width compared to each of the widths of the fourth portion 3b extending in the X direction and the sixth protruding portions 3c and 3d protruding in the Y direction. The fourth portion 3b is disposed across the plurality of pixels P arranged in the X direction. A length in the Y direction of the sixth protruding portion 3d protruding from the fifth body portion 3a is shorter than a length of the fifth protruding portion 42cy protruding from the fourth body portion 42cc of the fourth conductive layer 42c positioned in a lower layer. A first relay layer 3e having a quadrangle shape in plan view is provided at a position separated in the Y direction from the sixth protruding portion 3d. The first relay layer 3e is provided in the same wiring layer as the scanning line 3, and is provided to fill the second contact hole 44. Such a scanning line 3 is symmetrically disposed in the Y direction across the plurality of pixels P arranged in the X direction.

As illustrated in FIG. 12, the semiconductor layer 30a is disposed along the Y direction to overlap the fifth body portion 3a of the scanning line 3, the sixth protruding portions 3c and 3d protruding from the fifth body portion 3a in the Y direction, and the first relay layer 3e in plan view. In addition, to share the contact hole 33 (refer to FIG. 14) described below, the two semiconductor layers 30a are connected and disposed along the Y direction. In addition, the second contact hole 44 is provided in a portion overlapping the first relay layer 3e in an end portion of the semiconductor layer 30a disposed along the Y direction. Such a semiconductor layer 30a is also disposed in the non-opening areas surrounding the pixel P illustrated in FIG. 4 in a lattice shape.

As illustrated in FIG. 13, the second scanning line 4 includes a pair of expanding portions 4a disposed at both sides sandwiching the semiconductor layer 30a in the X direction at a position where the second scanning line 4 overlaps the fifth body portion 3a of the scanning line 3 in plan view, a main line portion 4b extending from the expanding portions 4a in the X direction, and a protruding portion 4c connected to the pair of expanding portions 4a and overlapping the semiconductor layer 30a in plan view. The pair of expanding portions 4a are provided with the pair of contact holes 31 and 32 electrically coupled to the scanning line 3 and the second scanning line 4. Such a second scanning line 4 is also disposed in the non-opening areas surrounding the pixel P illustrated in FIG. 4 in a lattice shape.

The protruding portion 4c of the second scanning line 4 functions as the gate electrode 30g of the TFT 30, and a portion of the semiconductor layer 30a overlapping the protruding portion 4c is the channel region 30c. In this exemplary embodiment, the LDD structure described above is formed in the semiconductor layer 30a by using the protruding portion 4c as a mask and selectively injecting impurity ions into the semiconductor layer 30a including polysilicon.

In the same wiring layer as the second scanning line 4, the second relay layer 4d having a quadrangle shape in plan view is disposed at a position where the second relay layer 4d overlaps the second contact hole 44. As illustrated in FIG. 5, the second relay layer 4d is provided to come in contact with the first relay layer 3e disposed ahead of the second contact hole 44.

As illustrated in FIG. 14, the relay electrode 5 includes a sixth body portion 5a, a protruding portion 5b protruding from the sixth body portion 5a to one side in the X direction, and a portion protruding from the sixth body portion 5a to one side in the Y direction to constitute the contact hole 34 and function as the drain electrode 5c. Such a relay electrode 5 is also disposed in the non-opening areas surrounding the pixel P illustrated in FIG. 4 in a lattice shape. The sixth body portion 5a of the relay electrode 5 is disposed at the intersection of the non-opening areas, and has a large width compared to each of the widths of the protruding portion 5b protruding to one side in the X direction and the drain electrode 5c protruding to one side in the Y direction.

The source electrode 5d is provided in the same layer as the relay electrode 5. Specifically, the source electrode 5d has a rectangular shape in plan view, and is disposed along the Y direction between the sixth body portions 5a adjacent to each other in the Y direction to overlap the semiconductor layer 30a. The contact hole 33 for achieving the electrical coupling to the source region 30s of the semiconductor layer 30a is provided in the center in the Y direction of the source electrode 5d.

As illustrated in FIG. 15, the data lines 6a are disposed to extend in the Y direction. In addition, the plurality of data lines 6a are disposed in parallel at a predetermined interval in the X direction in correspondence with an arrangement pitch in the X direction of the pixels P. The data lines 6a are electrically coupled via the contact hole 45 to the source electrode 5d provided in a lower layer. The contact hole 45 overlaps the data lines 6a, and two contact holes 45 are provided at positions separated in the Y direction from the contact hole 33 in association with the coupling to the source region 30s of the semiconductor layer 30a.

The relay electrode 6b having a rectangular shape in the X direction is provided between the data lines 6a adjacent to each other in the X direction. The contact hole 46 achieving the coupling to the protruding portion 5b of the relay electrode 5 positioned in a lower layer is provided in the relay electrode 6b. Such a data line 6a and such a relay electrode 6b are also disposed in the non-opening areas surrounding the pixel P indicated by the dashed line.

As illustrated in FIG. 16, the common potential lines 7 are disposed to extend in the Y direction, to overlap the data lines 6a described above in plan view. Thus, a plurality of the common potential lines 7 are disposed in parallel at a predetermined interval in the X direction in correspondence with the arrangement pitch in the X direction of the pixels P. The relay electrode 7b having a rectangular shape in the X direction is provided between the common potential lines 7 adjacent to each other in the X direction. The contact hole 47 achieving the coupling to the relay electrode 6b positioned in a lower layer is provided in the relay electrode 7b. Such a common potential line 7 and such a relay electrode 7b are also disposed in the non-opening areas surrounding the pixel P indicated by the dashed line.

As illustrated in FIG. 17, in plan view, the pixel electrode 15 is disposed for each pixel P to cause an outer edge of the pixel electrode 15 to overlap the common potential line 7 extending in the Y direction and the relay electrode 7b extending in the X direction. The contact hole 48 is provided on a center side in the X direction of the relay electrode 7b and at a position where the contact hole 48 overlaps the outer edge of the pixel electrode 15. The pixel electrode 15 is electrically coupled to the relay electrode 7b via the contact hole 48.

According to the wiring structure of the element substrate 10 of this exemplary embodiment, the two semiconductor layers 30a connected to share the contact hole 33 achieving the electrical coupling to the data line 6a are disposed in the Y direction to overlap the first body portion 41ac and the second portion Olay of the first conductive layer 41a of the holding capacitor 40, the second body portion 41cc and the second protruding portion 41cy of the second conductive layer 41c, the third body portion 42ac and the fourth protruding portion 42ay of the third conductive layer 42a, the fourth body portion 42cc and the fifth protruding portion 42cy of the fourth conductive layer 42c, and the fifth body portion 3a and the sixth protruding portions 3c and 3d of the scanning line 3 being as a light shielding layer, in plan view. In plan view, the first body portion 41ac, the second body portion 41cc, the third body portion 42ac, the fourth body portion 42cc, and the fifth body portion 3a are disposed to overlap one another at the intersections of the non-opening areas of the pixel P.

According to the liquid crystal device 100 of the exemplary embodiment described above, the following effects can be obtained.

(1) In the element substrate 10, the holding capacitor 40 and the scanning line 3 being as a light shielding layer are disposed between the base material 10s and the semiconductor layer 30a of the TFT 30. The holding capacitor 40 includes the two capacitance elements 41 and 42 electrically coupled in parallel. Therefore, compared to a case where the holding capacitor 40 is provided in an upper layer of the TFT 30 on the base material 10s, light incident from the element substrate 10 side and directed toward the semiconductor layer 30a can be blocked by the holding capacitor 40 and the scanning line 3, and thus it is possible to achieve a light shielding structure having an improved light shielding property with respect to the semiconductor layer 30a. In particular, of the plurality of conductive layers functioning as capacitance electrodes of the holding capacitor 40, the first conductive layer 41a provided at the base material 10s side includes the first portion 41ax extending in the X direction and the second portion Olay extending in the Y direction in a lattice shape surrounding the pixel P, and thus a gap does not occur in the non-opening areas as viewed from the base material 10s side. In a case where only the scanning line 3 is provided between the base material 10s and the semiconductor layer 30a, optical leakage occurs from a gap between the scanning lines 3 adjacent in the Y direction (between the sixth protruding portions 3c adjacent in the Y direction, and between the other sixth protruding portion 3d and the first relay layer 3e), and thus when the first conductive layer 41a in the lattice shape is provided between the base material 10s and the scanning line 3 as in this exemplary embodiment, a light shielding property better improves. That is, according to the exemplary embodiment described above, even when the arrangement pitch of the pixels P decreases and the non-opening areas becomes narrower, it is possible to secure electrical capacitance in the holding capacitor 40, and it is possible to suppress occurrence of optical leakage current of the TFT 30 due to light incident from the element substrate 10 side, and to provide the liquid crystal device 100 achieving stable display operation.

(2) The second contact hole 44 configured to electrically couple the second conductive layer 41c functioning as a capacitance electrode of the holding capacitor 40 and the drain region 30d of the semiconductor layer 30a of the TFT 30 includes the first relay layer 3e formed in the same layer as the scanning line 3, and the second relay layer 4d formed in the same layer as the second scanning line 4 functioning as the gate electrode 30g. Therefore, even when the depth of the second contact hole 44 on the base material 10s is deeper, the second conductive layer 41c and the drain region 30d of the semiconductor layer 30a can be coupled electrically. In addition, the portion of the first relay layer 3e being in contact with the second conductive layer 41c includes the same conductive material as the conductive material of the second conductive layer 41c. Since the conductive polysilicon is used, affinity of a contact portion improves, and it is possible to realize electrically stable coupling.

(3) Since the drain electrode 5c being in contact with the second relay layer 4d of the second contact hole 44 and in contact with the drain region 30d of the semiconductor layer 30a of the TFT 30 is provided, it is possible to reliably couple the semiconductor layer 30a and the second contact hole 44 via the drain electrode 5c even when the position where the second contact hole 44 is provided is restricted. That is, a degree of freedom of a relative positional relationship between the drain region 30d of the semiconductor layer 30a of the TFT 30 and the second contact hole 44 in plan view improves.

Electronic Apparatus

Figure 18:
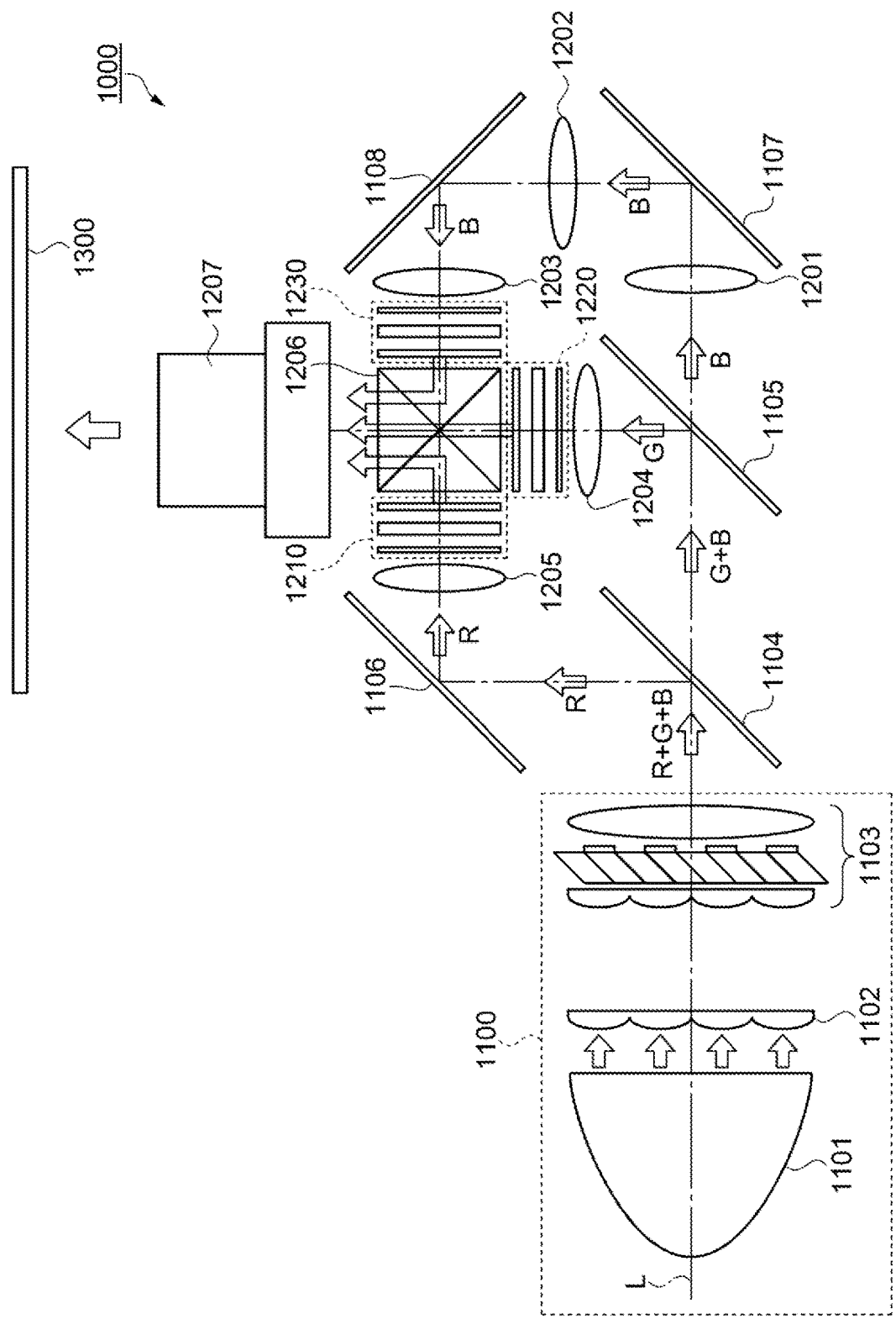
FIG. 18 is a schematic view illustrating a configuration of a projection-type display device as an electronic apparatus.

Next, an electronic apparatus of this exemplary embodiment will be described by using a projection-type display device as an example. FIG. 18 is a schematic view illustrating a configuration of a projection-type display device as the electronic apparatus.

As illustrated in FIG. 18, a projection-type display device 1000 being as an electronic apparatus according to this exemplary embodiment includes a polarized light illumination device 1100 disposed along a system optical axis L, and two dichroic mirrors 1104 and 1105 being light separation elements. In addition, the projection-type display device 1000 includes three reflection mirrors 1106, 1107, and 1108 and five relay lenses 1201, 1202, 1203, 1204, and 1205. Further, the projection-type display device 1000 includes liquid crystal light valves 1210, 1220, and 1230 of a transmissive type being as three light modulation means, a cross dichroic prism 1206 being as a photosynthetic element, and a projection lens 1207.

The polarized light illumination device 1100 generally includes a lamp unit 1101 being a light source including a white light source such as an extra-high pressure mercury lamp or a halogen lamp, an integrator lens 1102, and a polarization conversion element 1103. Note that a solid light source such as a laser light source and an LED corresponding to each of red light (R), green light (G), and blue light (B) may be used as the light source.

The dichroic mirror 1104 reflects the red light (R) of a polarized light flux exiting from the polarized light illumination device 1100 and transmits the green light (G) and the blue light (B). The other dichroic mirror 1105 reflects the green light (G) transmitted by the dichroic mirror 1104 and transmits the blue light (B).

The red light (R) reflected by the dichroic mirror 1104 is reflected by the reflection mirror 1106 and subsequently is incident on the liquid crystal light valve 1210 via the relay lens 1205.

The green light (G) reflected by the dichroic mirror 1105 is incident on the liquid crystal light valve 1220 via the relay lens 1204.

The blue light (B) transmitted by the dichroic mirror 1105 is incident on the liquid crystal light valve 1230 via a light guide system including the three relay lenses 1201, 1202, and 1203 and the two reflection mirrors 1107 and 1108.

The liquid crystal light valves 1210, 1220, and 1230 are each disposed to face an incident surface of each type of color light of the cross dichroic prism 1206. The color light incident on the liquid crystal light valves 1210, 1220, and 1230 is modulated based on video information (video signal) and exits toward the cross dichroic prism 1206. In this prism, four rectangular prisms are bonded together, and in inner surfaces of the prisms, a dielectric multilayer film configured to reflect the red light and a dielectric multilayer film configured to reflect the blue light are formed in a cross shape. The three types of color light are synthesized by these dielectric multilayer films, and light representing a color image is synthesized. The synthesized light is projected onto a screen 1300 by the projection lens 1207 being as a projection optical system, and an image is enlarged and displayed.

The liquid crystal light valve 1210 is a liquid crystal valve to which the liquid crystal device 100 (refer to FIG. 1) of the exemplary embodiment described above is applied. A pair of light-polarizing elements disposed in a crossed-Nicols state at an incident side and an exit side of the color light of the liquid crystal device 100 are disposed with a gap interposed between the pair of light-polarizing elements. The same applies to the other liquid crystal light valves 1220 and 1230.

According to such a projection-type display device 1000, the liquid crystal device 100 of the exemplary embodiment described above is used as the liquid crystal light valves 1210, 1220 and 1230, and the holding capacitor 40 in the pixel circuit includes the two capacitance elements 41 and 42. As a result, a capacitance value of the 40 is easily ensured as compared to a capacitance value holding capacitor in the related art. That is, even in a case where the pixels P are made smaller in size and the pixels P are disposed in the display region E at high density to project a high-resolution image, potential imparted to the pixel electrode 15 can be held for a predetermined period of time. In addition, since a light shielding structure making it difficult for light incident on the pixel P to be incident on the semiconductor layer 30*a* of the TFT 30 is provided, an optical leakage current at the TFT 30 does not readily occur even when intense light from the light source is incident on the pixel P, and stable display operation is obtained. That is, the projection-type display device 1000 capable of stably projecting a high-quality image can be provided.

Note that, the present disclosure is not limited to the exemplary embodiments described above, and various modifications and improvements can be added to the above-described embodiments. Such modifications will be described below.

Modification 1

In the liquid crystal device 100 of the exemplary embodiment described above, the two semiconductor layers 30*a* are connected to share the contact hole 33 achieving the electrical coupling to the data line 6*a*. However, the configuration is not limited this, and the semiconductor layer 30*a* may be disposed independently in the non-opening areas for each pixel P.

Modification 2

In the liquid crystal device 100 of the exemplary embodiments described above, light from the light source may be incident from the counter substrate 20 side of the liquid crystal panel 110. Light incident on the element substrate 10 from the counter substrate 20 side and directed toward the semiconductor layer 30*a* of the TFT 30 can be blocked by the common potential line 7, the data line 6*a*, and the relay electrode 5. In addition, even when the light incident from the counter substrate 20 side and exiting from the opening area of the element substrate 10 is reflected by a structure such as a polarizing element disposed in an exit direction, and stray light incident on the element substrate 10 occurs again, the stray light incident on the semiconductor layer 30*a* of the TFT 30 can be blocked by the holding capacitor 40 and the scanning line 3.

Modification 3

The electro-optical device to which the light shielding structure of the element substrate 10 according to the exemplary embodiments is applicable is not limited to the transmissive type liquid crystal device 100. For example, the light shielding structure of the element substrate 10 according to the exemplary embodiments is also applicable to an active drive type light-emitting device provided with a light emitting element such as an organic EL for each pixel P of the element substrate 10. The holding capacitor 40 and the scanning line 3 can block light from the light emitting element that becomes stray light to be incident on the semiconductor layer of the transistor.

Fourth Modification

The electronic apparatus to which the liquid crystal device 100 of the exemplary embodiment described above is applied is not limited to the projection-type display device 1000. For example, the counter substrate 20 of the liquid crystal device 100 may include color filters corresponding to at least red (R), green (G), and blue (B), and the liquid crystal light valve may include a single plate configuration. In addition, the liquid crystal device 100 can be used suitably as, for example, a display unit of a projection-type Head-Up Display (HUD), a Head-Mounted Display (HMD), an electronic book, a personal computer, a digital still camera, a liquid crystal television, a view finder-type or monitor direct view-type video recorder, a car navigation system, an electronic diary, and an information terminal device such as Point Of Sale (POS) terminal.

Contents derived from the exemplary embodiments describe above will be described below.

An electro-optical device according to the present application includes a substrate, a transistor, a light shielding layer between the substrate and the transistor, and a holding capacitor between the substrate and the light shielding layer. In the electro-optical device, the holding capacitor includes a first conductive layer, a second conductive layer provided on the first conductive layer via a first capacitor insulating layer, a third conductive layer electrically coupled to the second conductive layer via a first contact hole provided in an insulating layer covering the second conductive layer, and a fourth conductive layer provided on the third conductive layer via a second capacitor insulating layer.

According to the configuration of the present application, the first conductive layer and the second conductive layer facing each other via the first capacitor insulating layer constitute one capacitance element, and the third conductive layer and the fourth conductive layer facing each other via the second capacitor insulating layer constitute another capacitance element. In addition, the second conductive layer and the third conductive layer are electrically coupled via the first contact hole provided in the insulating layer and thus, as long as any one of the second conductive layer and the third conductive layer is coupled to the transistor and the first conductive layer and the fourth conductive layer are coupled to cause at least one of the capacitance elements to function as capacitance wiring, the holding capacitor of the present application includes two capacitance elements electrically coupled in parallel. Therefore, a holding capacitor having large electrical capacitance can be configured without providing a convex portion in the substrate as in the related art. In addition, since the first conductive layer to the fourth conductive layer functioning as capacitance electrodes and the light shielding layer are provided between the substrate and the transistor, light incident from the substrate side and directed toward the transistor can be blocked by these conductive layers and the light shielding layer. That is, an electro-optical device including a light shielding structure ensuring electrical capacitance in the holding capacitor and having an improved light shielding property with respect to a transistor can be provided.

In the electro-optical device described above, preferably the first conductive layer includes a first body portion, a first portion extending from the first body portion in a first direction, and a second portion extending from the first body portion in a second direction intersecting the first direction, the second conductive layer includes a second body portion, a first protruding portion protruding from the second body portion in the first direction, and a second protruding portion protruding from the second body portion in the second direction, the third conductive layer includes a third body portion, a third protruding portion protruding from the third body portion in the first direction, and a fourth protruding portion protruding from the third body portion in the second direction, the fourth conductive layer includes a fourth body portion, a third portion extending from the fourth body portion in the first direction, and a fifth protruding portion protruding from the fourth body portion in the second direction, the light shielding layer includes a fifth body portion, a fourth portion extending from the fifth body portion in the first direction, and a sixth protruding portion protruding from the fifth body portion in the second direction, and the first body portion, the second body portion, the third body portion, the fourth body portion, and the fifth body portion are disposed to overlap one another in plan view.

According to this configuration, portions protruding in the first direction and the second direction are provided starting from the second body portion and the third body portion disposed to overlap each other in plan view, and thus an area functioning as a capacitance electrode is ensured. In addition, the first conductive layer includes the first portion extending in the first direction and the second portion extending in the second direction, and the fourth conductive layer includes the third portion extending in the first direction. Thus, both or one of the first conductive layer and the fourth conductive layer can be used as capacitance wiring.

In the electro-optical device described above, preferably a semiconductor layer of the transistor is disposed, in the second direction, to overlap the first body portion and the second portion of the first conductive layer, the second body portion and the second protruding portion of the second conductive layer, the third body portion and the fourth protruding portion of the third conductive layer, the fourth body portion and the fifth protruding portion of the fourth conductive layer, and the fifth body portion and the sixth protruding portion of the light shielding layer, in plan view.

According to this configuration, light incident from the substrate and directed toward the semiconductor layer of the transistor can be blocked by the first body portion and the second portion of the first conductive layer, the second body portion and the second protruding portion of the second conductive layer, the third body portion and the fourth protruding portion of the third conductive layer, the fourth body portion and the fifth protruding portion of the fourth conductive layer, and the fifth body portion and the sixth protruding portion of the light shielding layer. That is, not only the first body portion to the fifth body portion but also the second portion, the second protruding portion, the fourth protruding portion, the fifth protruding portion, and the sixth protruding portion overlap one another on the substrate in plan view, and thus it is possible to improve a light shielding property of the transistor with respect to the semiconductor layer. In other words, even when one of these components lacks a light shielding property, the light shielding property can be ensured by the other overlapping components.

In the electro-optical device described above, preferably the first contact hole is disposed to overlap the second body portion of the second conductive layer in plan view.

According to this configuration, the second body portion of the second conductive layer and the third body portion of the third conductive layer can be coupled electrically via the first contact hole.

In the electro-optical device described above, preferably an end portion of the second protruding portion of the second conductive layer is disposed to protrude from an end portion of the fourth protruding portion of the third conductive layer in the second direction, and a second contact hole configured to electrically couple the second conductive layer and the semiconductor layer of the transistor is disposed in the end portion of the second protruding portion.

According to this configuration, since the second conductive layer and the third conductive layer are electrically coupled via the first contact hole, the second conductive layer and the third conductive layer can be coupled electrically to the semiconductor layer of the transistor via the second contact hole. In addition, the second contact hole is disposed at the end portion of the second protruding portion of the second conductive layer, and thus an area of the second conductive layer disposed via the first capacitor insulating layer with respect to the first conductive layer can be made larger than an area of the third conductive layer. In other words, electrical capacitance of one capacitance element including the second conductive layer as a capacitance electrode can be maximized.

In the electro-optical device described above, preferably the second contact hole is provided with a first relay layer provided in the same layer as the light shielding layer, and a second relay layer provided in the same layer as a gate electrode of the transistor.

According to this configuration, the first relay layer and the second relay layer are provided, and thus even when a depth of the second contact hole on the substrate is deeper, the second conductive layer and the semiconductor layer of the transistor can easily be coupled electrically as compared to a case where the second contact hole is filled with one relay layer to have electrical conductivity.

In the electro-optical device described above, preferably the second conductive layer and a portion of the first relay layer being in contact with the second conductive layer include the same conductive material.

According to this configuration, since affinity between the second conductive layer and the first relay layer is ensured, the second contact hole can reliably be coupled electrically to the second conductive layer.

In the electro-optical device described above, preferably the same conductive material is a polysilicon imparted conductivity.

According to this configuration, since conductive polysilicon is used, a coating property in forming the first relay layer in the second contact hole improves and the electrical coupling in the second contact hole is stable, as compared to other metal materials.

The electro-optical device described above preferably includes an electrode being in contact with the second relay layer and being in contact with the semiconductor layer of the transistor.

According to this configuration, the second conductive layer and the semiconductor layer of the transistor can be coupled electrically via the second contact hole and the electrode. since the second conductive layer and the semiconductor layer of the transistor can be coupled electrically via the electrode, a degree of freedom of a plan view relative positional relationship between the semiconductor layer of the transistor and the second contact hole in improves.

An electronic apparatus according to the present application includes the electro-optical device described above.

According to the configuration of the present application, an electro-optical device including a light shielding structure ensuring electrical capacitance in a holding capacitor and having an improved light shielding property with respect to a transistor is provided. As a result, even when intense light is incident on a pixel from a light source, occurrence of an optical leakage current in a semiconductor layer of a transistor is suppressed, and it is possible to provide an electronic apparatus achieving a stable operation state.

What is claimed is:

1. An electro-optical device comprising:
   a substrate;
   a transistor;
   a light shielding layer between the substrate and the transistor; and
   a holding capacitor between the substrate and the light shielding layer, wherein
   the holding capacitor includes
   a first conductive layer,
   a second conductive layer provided on the first conductive layer via a first capacitor insulating layer,
   a third conductive layer electrically connected to the second conductive layer via a first contact hole provided in an insulating layer covering the second conductive layer, and
   a fourth conductive layer provided on the third conductive layer via a second capacitor insulating layer.

2. The electro-optical device according to claim 1, wherein
   the first conductive layer includes
   a first body portion,
   a first portion extending from the first body portion in a first direction, and
   a second portion extending from the first body portion in a second direction intersecting the first direction,
   the second conductive layer includes
   a second body portion,
   a first protruding portion protruding from the second body portion in the first direction, and
   a second protruding portion protruding from the second body portion in the second direction,
   the third conductive layer includes
   a third body portion,
   a third protruding portion protruding from the third body portion in the first direction, and
   a fourth protruding portion protruding from the third body portion in the second direction,
   the fourth conductive layer includes
   a fourth body portion,
   a third portion extending from the fourth body portion in the first direction, and
   a fifth protruding portion protruding from the fourth body portion in the second direction,
   the light shielding layer includes
   a fifth body portion,
   a fourth portion extending from the fifth body portion in the first direction, and
   a sixth protruding portion protruding from the fifth body portion in the second direction, and
   the first body portion, the second body portion, the third body portion, the fourth body portion, and the fifth body portion are disposed to overlap one another in plan view.

3. The electro-optical device according to claim 2, wherein
   a semiconductor layer of the transistor is disposed, in the second direction, to overlap the first body portion and the second portion of the first conductive layer, the second body portion and the second protruding portion of the second conductive layer, the third body portion and the fourth protruding portion of the third conductive layer, the fourth body portion and the fifth protruding portion of the fourth conductive layer, and the fifth body portion and the sixth protruding portion of the light shielding layer, in plan view.

4. The electro-optical device according to claim 2, wherein
   the first contact hole is disposed to overlap the second body portion of the second conductive layer in plan view.

5. The electro-optical device according to claim 2, wherein
   an end portion of the second protruding portion of the second conductive layer is disposed to protrude from an end portion of the fourth protruding portion of the third conductive layer in the second direction, and a second contact hole configured to electrically connect the second conductive layer and the semiconductor layer of the transistor is disposed in the end portion of the second protruding portion.

6. The electro-optical device according to claim 5, wherein
   the second contact hole is provided with a first relay layer provided in the same layer as the light shielding layer and a second relay layer provided in the same layer as a gate electrode of the transistor.

7. The electro-optical device according to claim 6, wherein the second conductive layer and a portion of the first relay layer in contact with the second conductive layer include a same conductive material.

8. The electro-optical device according to claim 7, wherein the same conductive material is a polysilicon imparted with conductivity.

9. The electro-optical device according to claim 6, comprising:

an electrode in contact with the second relay layer and in contact with the semiconductor layer of the transistor.

10. An electronic apparatus comprising the electro-optical device according to claim 1.

* * * * *